(12) United States Patent
Iyoki

(10) Patent No.: US 8,058,780 B2
(45) Date of Patent: Nov. 15, 2011

(54) CIRCULAR CYLINDER TYPE PIEZOELECTRIC ACTUATOR AND PIEZOELECTRIC ELEMENT AND SCANNING PROBE MICROSCOPE USING THOSE

(75) Inventor: Masato Iyoki, Chiba (JP)

(73) Assignee: SII NanoTechnology Inc. (JP)

( * ) Notice: Subject to any disclaimer, the term of this patent is extended or adjusted under 35 U.S.C. 154(b) by 348 days.

(21) Appl. No.: 12/378,139

(22) Filed: Feb. 11, 2009

(65) Prior Publication Data

US 2009/0206707 A1    Aug. 20, 2009

(30) Foreign Application Priority Data

Feb. 12, 2008 (JP) ................... 2008-030614

(51) Int. Cl.
*H01L 41/04* (2006.01)

(52) U.S. Cl. ........................................ 310/369

(58) Field of Classification Search .................. 310/369
See application file for complete search history.

(56) References Cited

U.S. PATENT DOCUMENTS 7,170,048 B2 *  1/2007  Kakemizu ................ 250/234

FOREIGN PATENT DOCUMENTS

JP          07249392 A  *  9/1995
JP          11259133 A  *  9/1999

* cited by examiner

*Primary Examiner* — Jaydi San Martin
(74) *Attorney, Agent, or Firm* — Adams & Wilks

(57) ABSTRACT

The cylindrical piezoelectric actuator which comprised a piezoelectric element which provided electrode in each of an inner peripheral face and an outer peripheral face which was cylindrical at least, and drive power supply to drive it. And the outer side electrode of the piezoelectric element covered the substantially circumferential outer face entirety and it was connected to a ground potential, and the electrode in the internal perimeter surface connected to drive power supply.

11 Claims, 15 Drawing Sheets

INNER SIDE ELECTRODE

OUTER SIDE ELECTRODE

F I G. 6
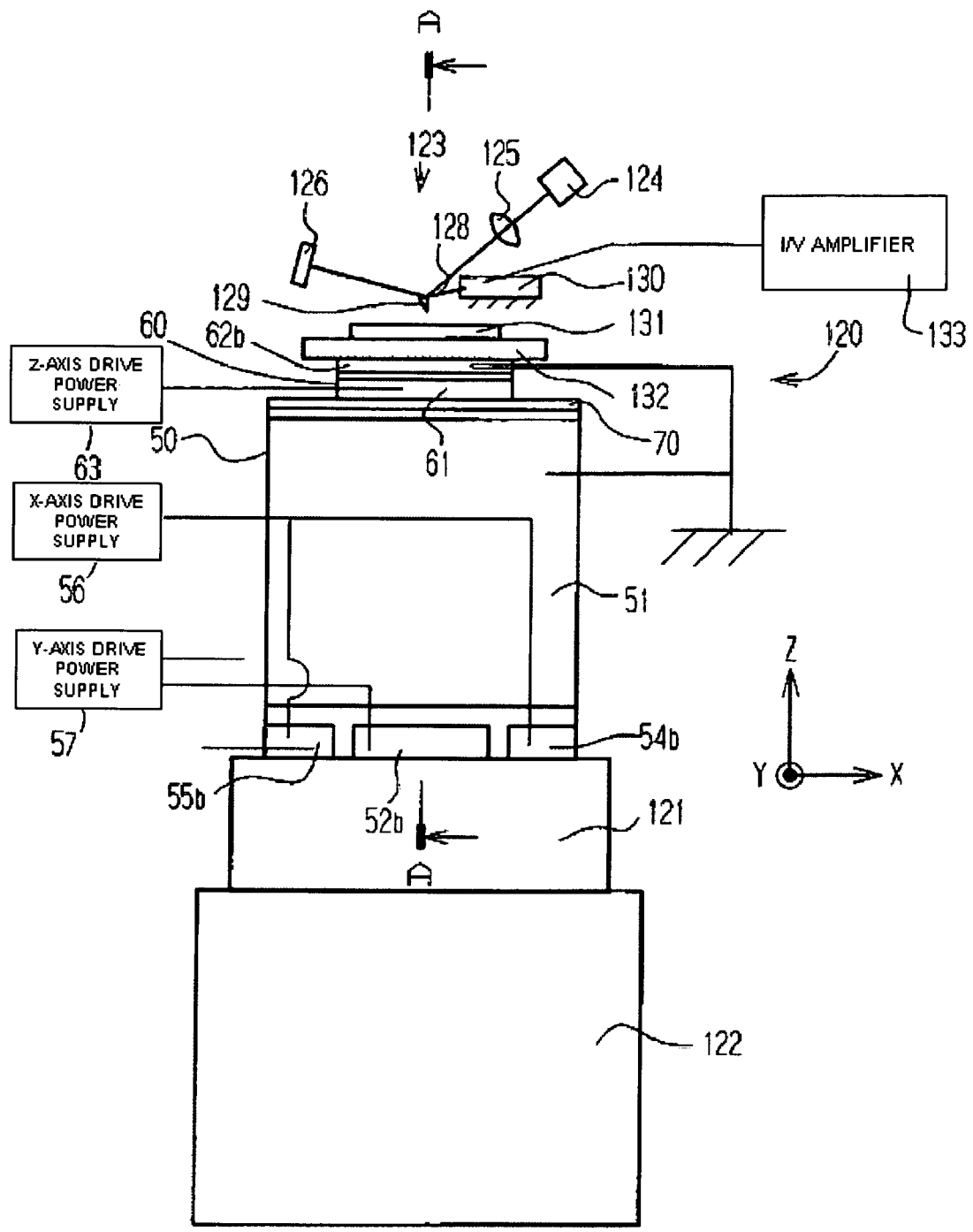

INNER SIDE ELECTRODE

OUTER SIDE ELECTRODE

CIRCULAR CYLINDER TYPE PIEZOELECTRIC ACTUATOR AND PIEZOELECTRIC ELEMENT AND SCANNING PROBE MICROSCOPE USING THOSE

BACKGROUND OF THE INVENTION

1. Field of the Invention

The present invention relates to a circular cylinder type piezoelectric actuator used in a positioning apparatus of a precision apparatus or the like, and is applied to, for example, a scanner or the like for a scanning probe microscope.

2. Description of the Related Art

In a background art, a circular cylinder type piezoelectric actuator is used in various precision apparatus starting from a scanning probe microscope as a fine positioning apparatus of order to several hundreds micrometers from sub-nanometers.

Here, a positioning apparatus using a circular cylinder type piezoelectric actuator will be explained by taking an example of a scanning probe microscope (refer to Patent Reference 1). FIG. 11 is a constitution view of a scanning probe microscope of a background art, and FIG. 12 is a perspective view of a circular cylinder type piezoelectric actuator used as a 3 axes finely moving mechanism of the scanning probe microscope of FIG. 11. The scanning probe microscope of the background art is constituted by a cantilever 214 having a stylus 213 at a front end thereof, a sample holder 211 installed at a position opposed to the stylus 213 and mounted with a sample 212, a 3 axes finely moving mechanism 215 constituted by a horizontal direction finely moving mechanism for moving the stylus 213 relative to a surface of the sample and a vertical direction finely moving mechanism for moving the stylus 213 in a direction orthogonal to the surface of the sample, and a displacement detecting mechanism 219 for detecting bending of the cantilever 214.

According to the background art of FIG. 11, the circular cylinder type piezoelectric actuator 215 as shown by FIG. 12 is used at the 3 axes finely moving mechanism 215. A circular cylinder type piezoelectric element constituting the circular cylinder type piezoelectric actuator 215 is subjected to a polarization processing in a direction orthogonal to a center axis of a circular cylinder from an inner peripheral face in a direction of an outer peripheral face thereof. The inner peripheral face of the circular cylinder type piezoelectric element is formed with a single common electrode 232, and the outer peripheral face is provided with a strip electrode portion 235 provided along a circumference, and 4 divided electrode portions 233, 234 which are divided in 4 with regard to the circumference in a direction in parallel with the center axis. When a side of providing the strip electrode portion 235 is constituted as a front end and a side of providing the 4 divided electrode portions 233, 234 is constituted as a distal end, the front end is attached with the cantilever 214, and the distal end is fixed to a base (not illustrated).

According to the circular cylinder type piezoelectric actuator, the 4 divided electrode portions 233, 234 are operated as a horizontal direction fine moving mechanism, and the strip electrode portions 235 is operated as the vertical direction finely moving mechanism. When the circular cylinder type piezoelectric actuator is driven, the common electrode 232 of the inner peripheral face is connected to a ground potential, and voltages of inverse phases are respectively applied between two of electrodes of the 4 divided electrode portions 233, 234 opposed to each other relative to the center axis. At this occasion, one of the electrodes is elongated in a direction in parallel with the center axis, another one of the electrodes is contracted, as a result, bending is produced at the circular cylinder type piezoelectric element and the front end carries out a circular arc movement. Here, a moving amount of the circular arc moving is small, and therefore, the stylus 213 can be moved substantially in parallel with in-face of the sample 212. By making another one of two electrodes opposed to each other carry out a similar operation, the stylus 213 can be moved to two-dimensionally in-face of the sample 212.

Further, when a voltage is applied to the strip electrode portion 235 of the outer peripheral face, a strain is generated in a diameter direction, as a result, a strain is produced also in a direction in parallel with the center axis, and the stylus 213 can be moved in a direction orthogonal to the sample 212.

An optical lever method is generally used for the displacement detecting mechanism of the cantilever 214. The displacement detecting mechanism 219 is constituted by a semiconductor laser 216, a converging lens 217, and a photodetector 218. Light of the semiconductor laser 216 is converged to a back face of the cantilever 214 by the converging lens 217, and light reflected by the back face of the cantilever 214 is detected by the photodetector 218. When bending is produced at the cantilever 214, a position of a spot on the photodetector 218 is changed and bending of the cantilever 214 can be detected by detecting a change amount.

When the stylus 213 and the sample 212 are made to be proximate to each other by the scanning probe microscope constituted in this way, an atomic force or a contact force is operated and bending is produced at the cantilever 214. At this occasion, the bending amount depends on a distance between the stylus 213 and the sample 212, and therefore, the bending amount is detected by the displacement detecting mechanism 219 of the cantilever 214, the vertical direction finely moving mechanism is operated by a control circuit 221 such that the bending amount becomes constant, and while carrying out a feedback control such that the distance between the stylus 213 and the sample 212 becomes constant, by subjecting the horizontal direction fine moving mechanism to raster scanning by a scanning circuit 222, an image of recesses and projections of the sample surface can be measured. Further, other than the contact system of detecting a static bending of the cantilever 214, there is also a case of carrying out a measurement by a vibration system of controlling the distance between the stylus 213 and the sample 212 by a change amount of amplitude or a phase or a frequency by the atomic force or an intermittent contact force by vibrating the cantilever 214 at a vicinity of a resonance frequency.

Meanwhile, the 3 axes finely moving mechanism 215 used as the positioning apparatus of the scanning probe microscope is constituted by the piezoelectric element, and therefore, hysteresis or creep is produced. Hysteresis is a phenomenon in which when the voltage is applied to the piezoelectric element, the displacement does not become completely linear relative to the voltage but an operation similar to a quadratic curve is carried out. Further, creep is a phenomenon in which when a certain voltage is applied to a piezoelectric element, a target moving amount is not reached immediately but small movements are carried out little by little over time.

When the hysteresis or the creep is generated, it is difficult to carry out accurate positioning, and therefore, normally, the hysteresis or the creep is corrected by a previously set calibration equation. Further, according to the correction by the calibration equation, it is necessary to take various parameters of a scanning speed and a scanning angle or a scanning amount or the like into consideration and there is a case of producing an error depending on a drive condition, and therefore, there is also a case of compensating for the hysteresis or the creep by detecting a displacement of the positioning apparatus by using a displacement detecting apparatus of detecting a displacement of the piezoelectric element as a more accurate positioning means.

Although various systems of an optical type sensor or an electrostatic capacitance sensor, a magnetic type sensor and the like are used for the displacement detecting apparatus of the piezoelectric element, detection by a strain gage is effective as a method which occupies a space the least, is inexpensive and simple.

FIG. 12 shows a circular cylinder type piezoelectric actuator attached with a displacement meter of detecting a displacement of a 3 axes finely moving mechanism of a scanning probe microscope of a background art by the strain gage. According to the background art, strain gages 201a, 201b, 202a, 202b are adhered to the 4 divided electrode portions 233, 234 of the outer peripheral face of the circular cylinder type piezoelectric element 215 sheet by sheet to the respective electrodes. Further, 2 sheets of strain gages 203a, 203b are adhered to the strip electrode portion 235 in parallel with the center axis. The strain gage is a strain gage on sale generally, and is adhered in a direction of providing a large output when a strain is generated in a direction in parallel with the center axis of the circular cylinder type piezoelectric element. In a general strain gage, an insulating material of polyimide resin or paper, phenolic resin, epoxy resin, phenolic/epoxy mixture resin or the like is used for a base member, a resistance member constituted by a metal material of copper nickel alloy, nichrome species alloy or the like, or a semiconductor of a silicon single crystal or the like is provided on the base member, and is electrically connected to an outside detecting apparatus by way of an electrode pattern of nickel or the like formed on the base member similarly.

According to the horizontal direction finely moving mechanism, a bridge circuit as shown by FIG. 13 is integrated by respective 2 sheets of the strain gages 201a, 201b, 202a, 202b pasted on two electrodes 233, 234 opposed to each other and two of fixed resistors 241, 242, a bridge voltage e0 is applied to the bridge circuit, and an output voltage e1 is measured. When a strain is produced at the piezoelectric element, resistance values of the strain gages 201a, 201b, 202a, 202b are changed and a value of the output voltage e1 is changed. A strain amount of the piezoelectric element can be measured by detecting the output voltage e1. Further, according to the background art, respective 2 axial sheets of the gages 201a, 201b, 202a, 202b are adhered to the electrodes 233, 234 opposed to each other relative to the center axis, and therefore, directions of respective strains are reversed by bending the horizontal direction finely moving mechanism relative to the center axis, and therefore, also signs of detecting signals of the respective strain gages are reversed, an output voltage twice as much as that in a case of pasting the strain gage only to 1 sheet of the electrode can be provided and a signal intensity relative to noise is increased. Further, temperature compensation is also carried out by canceling an amount of a change of the resistance value in accordance with a change in a temperature.

Further, in the case of the vertical direction finely moving mechanism, a bridge circuit is integrated as shown by FIG. 14 by 2 sheets of strain gages 203a, 203b and two fixed resistors 241, 242, a bridge voltage e0 is applied to the bridge circuit, and the output voltage e1 is measured. When a strain is produced at the piezoelectric element, a resistance value of the strain gage is changed and a value of the output voltage e1 is changed. The strain amount of the piezoelectric element can be measured by detecting the output voltage e1. Also in this case, an output voltage twice as much as that of a case of 1 sheet of the gage can be provided. However, compensation of an amount of a change in the resistance value in accordance with a change in a temperature is not carried out in the circuit.

Further, according to the output of the strain gage, the displacement and the output voltage e1 are calibrated from data when a sample for calibration is measured by other displacement meter a displacement of which is previously calibrated and the scanning probe microscope using the 3 axes finely moving mechanism, and a displacement amount can be measured from the output voltage e1 provided.

In this way, a feedback control is carried out such that the 3 axes finely moving mechanism is linearly operated relative to an applied voltage from displacement information measured at any time from the output voltage of the strain gage in this way. Further, it is not necessarily needed to carry out linear operation relative to the voltage in the vertical direction according to the scanning probe microscope and there is also a case of displaying height information provided from the output signal of the strain gage as it is.

Next, FIG. 15 through FIG. 17 show a scanning probe microscope of other background art (refer to Patent Reference 2).

The background art relates to a scanning tunnel microscope using a circular cylinder type piezoelectric actuator which is a kind of a scanning probe microscope. FIG. 15 is a constitution view of the scanning tunnel microscope of the background art, FIG. 16 is a perspective view of a circular cylinder type piezoelectric element used as a horizontal direction finely moving mechanism in FIG. 15, and FIG. 17 is a sectional view taken along a line B-B of FIG. 16.

According to the background art, a 3 axes finely moving mechanism 305 is realized by integrating together 2 pieces of circular cylinder type piezoelectric elements of that for a vertical direction finely moving mechanism 314 and that for a horizontal finely moving mechanism 306.

A circular cylinder type piezoelectric element 308 as shown by FIG. 16 is used for the horizontal direction finely moving mechanism 306. The circular cylinder type piezoelectric element 308 is constituted by a structure of being provided with 4 divided electrode portions (309a, 309b, 310a, 310b) at an outer periphery similar to the horizontal direction finely moving mechanism of the preceding background art, and provided with a common electrode 311 in a strip-like shape at an inner peripheral face. Further, the vertical direction finely moving mechanism 314 is constituted by a structure of being provided with strip electrode portions (316, 317) respectively at an outer peripheral face and an inner peripheral face similar to the vertical direction finely moving mechanism of the preceding background art.

2 pieces of the circular cylinder type piezoelectric elements (308, 315) are arranged in a shape of concentric circles such that respective center axes thereof coincide with each other by arranging the horizontal direction finely moving mechanism 306 at an outer periphery and the vertical direction finely moving mechanism 314 at an inner periphery, 2 pieces of the circular cylinder type piezoelectric elements (308, 315) use a connecting member 312 in a cylinder shape and having a flange portion c, the flange portion c of the connecting member 312 is fixed to a front end of the horizontal direction finely moving mechanism 306, and the vertical direction finely moving mechanism 314 is fixed to a bottom face of an inner side of the cylinder.

Respective electrodes of the 4 divided electrode portions (309a, 309b, 310a, 310b) of the outer peripheral face of the horizontal direction finely moving mechanism 306 are connected with drive power supplies (320, 321) for respective electrodes, and connected such that polarities of the electrodes opposed to each other by interposing an center axis differ from each other, grounds of the respective drive power supplies (320, 321) are commonly connected and connected to the strip electrode 311 of the inner peripheral face.

Further, also the vertical direction finely moving mechanism 314 is connected with a drive power supply 322, the strip electrode 316 of the outer peripheral face is connected with a plus electrode of the drive electrode 322 and the strip electrode portion 317 of the inner peripheral face is connected with a minus electrode thereof.

Further, according to the background art, the outer peripheral face of the connecting member 312 is provided with a shield electrode 313, and the shield electrode is grounded.

A front end of the vertical direction finely moving mechanism 314 is provided with a probe holder 319, and the probe holder 319 is attached with a conductive stylus 318. A sample holder 303 is provided and a sample 304 is mounted at a position of being opposed to the stylus 318.

When a measurement is carried out by the scanning tunnel microscope, electrodes (309a, 309b) (310a, 310b) opposed to each other of the horizontal direction finely moving mechanism 306 are applied with voltages magnitudes of which are equal to each other and polarities of which differ from each other, and the circular cylinder type piezoelectric element 308 is deformed to bend, thereby, while subjecting the stylus 318 to raster scanning, an offset voltage is applied between the stylus 318 and the sample 304, and a recessed and projected shape of the sample 304 is measured while controlling a distance between the stylus 318 and the sample 304 by the vertical direction finely moving mechanism 314 such that a tunnel current which flows therebetween becomes constant.

At this occasion, although an electric field is changed by the voltage applied to the electrodes (9a, 9b, 10a, 10b, 11) of the horizontal direction finely moving mechanism 306 and electric noise is added to the vertical direction finely moving mechanism 314, according to the background art, by providing the shield electrode 313 to the connecting member 312 between the horizontal direction finely moving mechanism 306 and the vertical direction finely moving mechanism 314, electric noise generated in the horizontal direction finely moving mechanism 306 is prevented, and an excellent recessed and projected image can be provided.

Patent Reference 1: JP-A-9-89913
Patent Reference 2: JP-A-2002-55038

However, according to the circular cylinder type piezoelectric actuator of the background art constituted in this way, the following problem is posed.

The circular cylinder type piezoelectric actuator is integrated to inside of an apparatus of the scanning probe microscope. Inside of the apparatus is normally arranged with a wiring for driving the circular cylinder type piezoelectric actuator, a signal line of a displacement detecting signal of a cantilever, or in a case of using the displacement detecting apparatus of the piezoelectric element, a sensor or a wiring of the displacement detecting apparatus, further, in a case of detecting a physical property of the sample of an electric property or the like by the scanning probe microscope, a signal line or the like in a case of detecting the physical value in the form of surrounding an outer side electrode of the circular cylinder type piezoelectric actuator is arranged. Further, in a case of carrying out a measurement by a vibration system, a signal line used for oscillating a cantilever is arranged. Further, in order to make the sample and the stylus proximate to each other, or position in a measured portion of the sample in a sample face, there is a case of integrating an electromagnetic type stage for roughly moving in which an accuracy is rough and a moving amount is larger than those of the 3 axes finely moving mechanism.

When the circular cylinder type piezoelectric element is driven, a high voltage of several hundreds V order is normally applied, and therefore, a component of the high voltage applied to the outer electrode of the piezoelectric element is mixed to a part, a wiring member or the like surrounding the surrounding as noise. As a result, a measurement accuracy of the apparatus is deteriorated.

Further, there is also a case of mixing a signal of driving the electromagnetic motor of the roughly moving stage from an outer peripheral face electrode side of the circular cylinder type piezoelectric actuator as a noise component.

Further, when insulation of a part or a wiring member arranged at the outer side electrode of the circular cylinder type piezoelectric element is incomplete, there is a danger of destructing the apparatus by shortcircuiting the electrode of the outer peripheral face and the part or the wiring member surrounding the surrounding, or generating discharge in vacuum or the like.

Further, although according to the constitution of the scanning tunnel microscope of the background art, the electric signal of the horizontal direction finely moving mechanism can be prevented from being mixed to the vertical direction finely moving mechanism arranged at the inner periphery of the horizontal direction finely moving mechanism, the outermost periphery of the 3 axes finely moving mechanism is arranged with the 4 divided electrodes applied with the drive voltage, and therefore, electric noise cannot be prevented for a surrounding of the 3 axes finely moving mechanism.

SUMMARY OF THE INVENTION

Therefore, it is an object of the invention to provide a circular cylinder type piezoelectric actuator capable of restraining noise from being mixed between a circular cylinder type piezoelectric element and parts or wiring members arranged at a surrounding thereof when the circular cylinder type piezoelectric actuator is driven, preventing an erroneous operation of the apparatus and promoting a measurement accuracy, and promoting a reliability or a durability by preventing destruction of the apparatus by restraining shortcircuit of the parts or the wiring members surrounding the surrounding of the circular cylinder type piezoelectric element or discharge in vacuum from being brought about.

The invention provides the following means in order to resolve the problem.

According to the invention, there is provided a circular cylinder type piezoelectric actuator formed in a circular cylinder shape and including a circular cylinder type piezoelectric element respectively provided with electrodes at least at an inner peripheral face and at an outer peripheral face and a drive power supply of driving the circular cylinder type piezoelectric element, wherein a single strip electrode or divided electrodes divided into a plurality of regions and electrically conducted to each other are provided to cover substantially a total of the outer peripheral face of the circular cylinder, after connecting the electrode to a ground potential, the electrode on the inner peripheral face is connected to the drive power supply and a drive voltage is applied.

Further, according to the invention, the electrode of the inner peripheral face of the circular cylinder type piezoelectric element is divided into a plurality thereof. The divided electrodes of the inner peripheral face are fabricated by forming a strip electrode provided along the inner peripheral face at a portion or a total of the inner peripheral face and removing a portion of the strip electrode. Further, the divided electrodes are formed by providing a masking to a portion of the inner peripheral face, forming the electrodes at a portion other than the masking, thereafter, removing the masking.

Further, according to the invention, one end portion or both end portions of the outer peripheral face is (are) provided with a foldback portion(s) formed by extending the electrode formed at the inner peripheral face to fold back to a side of the outer peripheral face, and a surface area of the foldback electrode surfaced to the side of the outer peripheral face is made to be smaller than a surface area of the electrode formed at the outer peripheral face and connected to the ground potential.

Further, according to the invention, in a compound type circular cylinder type piezoelectric actuator constituted by connecting a plurality of circular cylinder type piezoelectric elements, an electrode provided at an outer periphery of the compound type circular cylinder type piezoelectric actuator and covering substantially a total of the outer peripheral face is connected to the ground potential.

According to the invention, a circular cylinder type piezoelectric actuator is constituted by using the circular cylinder type piezoelectric element constituted as described above and a scanning probe microscope is constituted by the circular cylinder type piezoelectric actuator.

According to the invention, the single strip electrode or the divided electrodes divided into the plurality of regions and electrically connected to each other are provided such that the electrode disposed at the outer periphery of the circular cylinder type piezoelectric actuator covers substantially a total of the outer peripheral face of the circular cylinder, after connecting the electrodes to the ground potential, the electrode on the inner peripheral face is connected to the drive power supply and the drive voltage is applied, and therefore, a signal for driving the circular cylinder type piezoelectric actuator is shielded by the electrode of the outer peripheral face, and noise owing to the electric signal for driving the piezoelectric actuator is prevented from being mixed to the apparatus or wiring members surrounding the circular cylinder type piezoelectric element. Further, conversely, noise from the surrounding apparatus to the electric signal for driving the piezoelectric actuator is also restrained from being mixed, an erroneous operation of the apparatus is prevented and also a measurement accuracy is promoted.

Further, the outer peripheral face of the circular cylinder type piezoelectric element is brought into the ground potential, and therefore, an accident of shortcircuiting with the surrounding apparatus or wiring members can be prevented, discharge in vacuum is also prevented, and a reliability or a durability of the apparatus is promoted.

BRIEF DESCRIPTION OF THE DRAWINGS

FIG. 6 is an outline view of a scanning probe microscope using a circular cylinder type piezoelectric actuator according to a third embodiment of the invention;

DETAILED DESCRIPTION OF THE PREFERRED EMBODIMENTS

The best mode for carrying out the invention will be explained in detail in reference to the drawings as follows.

Embodiment 1

Figure 1:
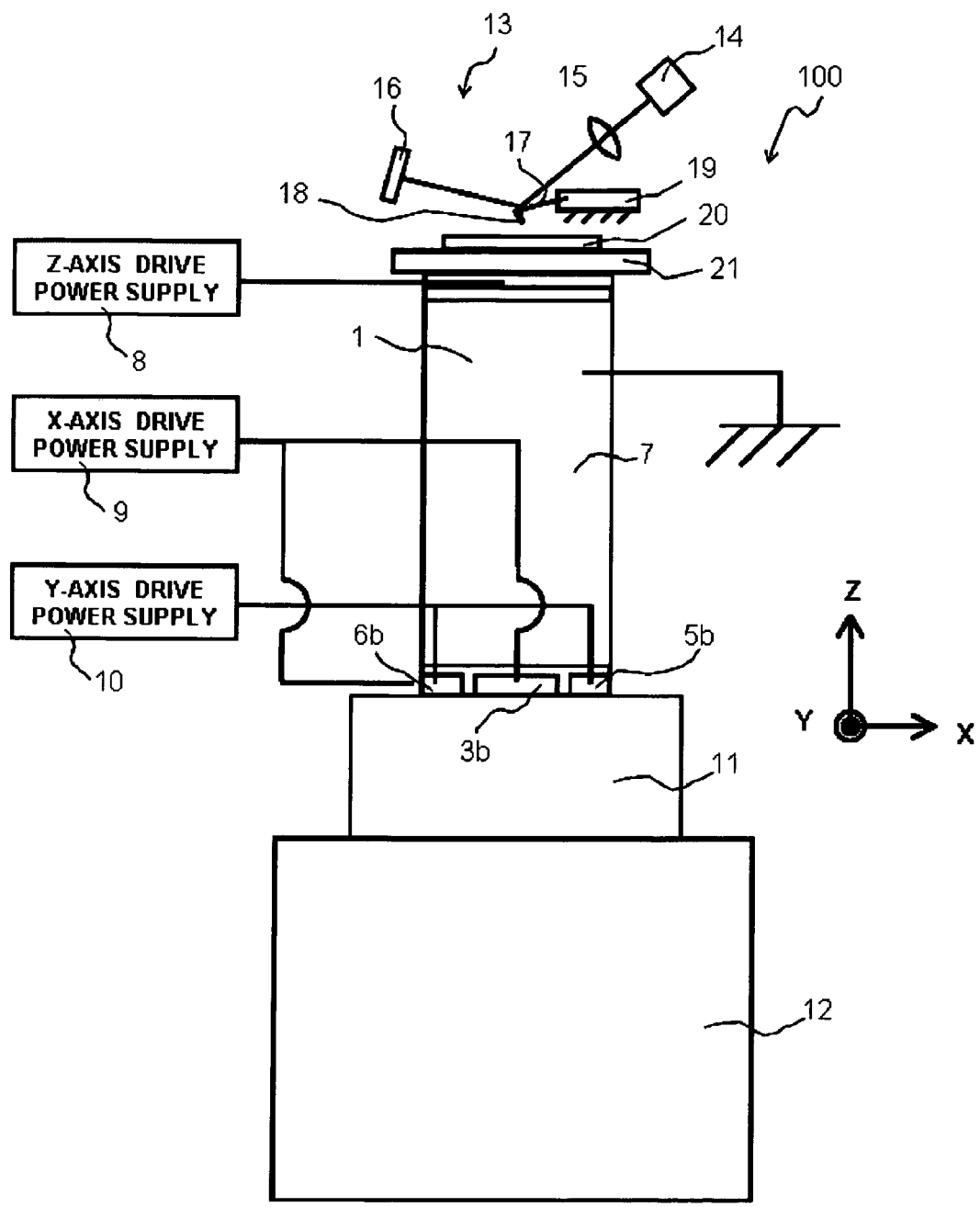
FIG. 1 is an outline view of a scanning probe microscope using a circular cylinder type piezoelectric actuator according to a first embodiment of the invention.
Figure 2A:
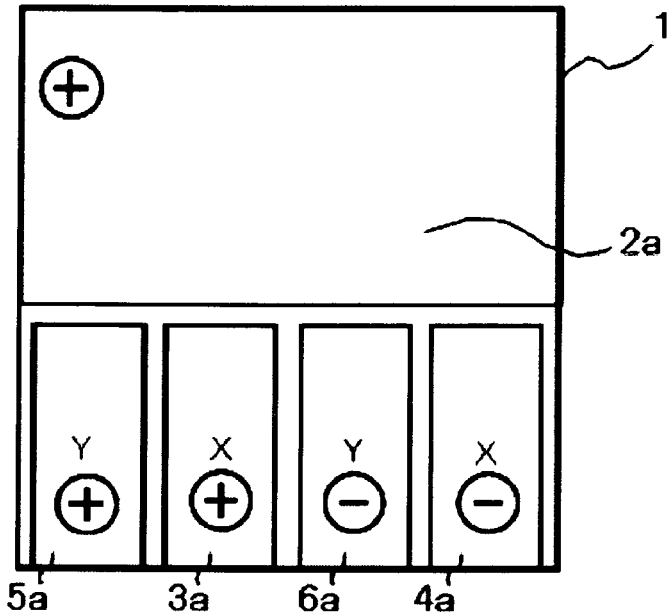
FIG. 2A is a development view of an inner peripheral face of a circular cylinder type piezoelectric element used in the first embodiment of the invention.
Figure 2B:
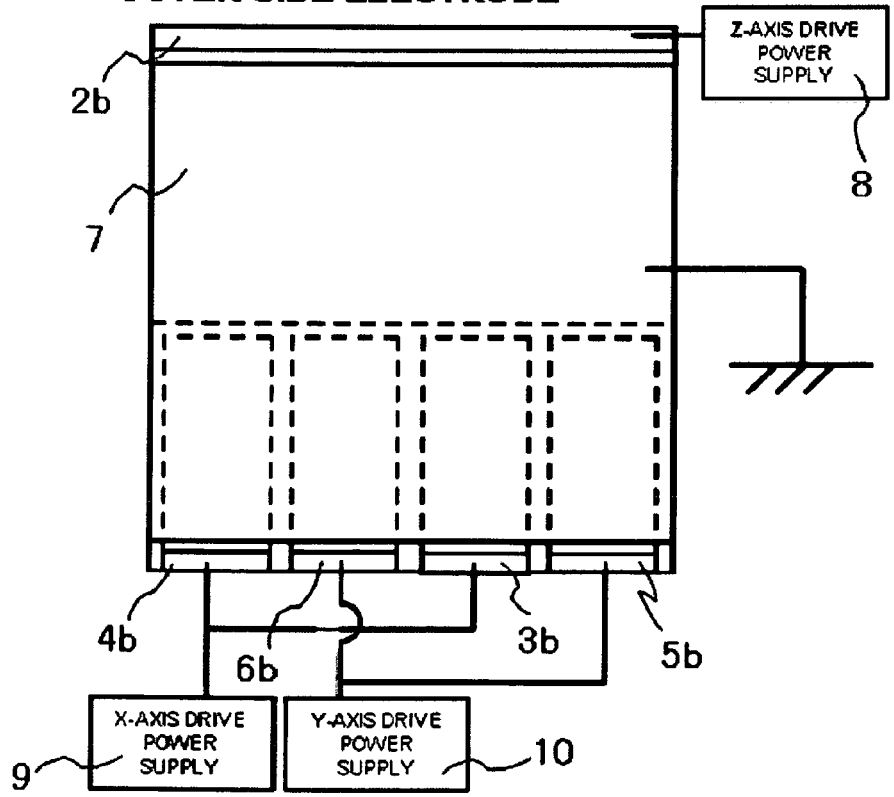
FIG. 2B is a development view of an outer peripheral face of the circular cylinder type piezoelectric element used in the first embodiment of the invention.

FIG. 1 and FIG. 2 show a scanning probe microscope using a circular cylinder type piezoelectric actuator according to a first embodiment of the invention. FIG. 1 is an outline view of a scanning probe microscope and FIGS. 2A and 2B are development views of a circular cylinder type piezoelectric element used in the scanning probe microscope of FIG. 1.

According to the embodiment, a 3 axes finely moving mechanism of a scanning probe microscope 100 is constituted by using a circular cylinder type piezoelectric element 1. As shown by FIG. 2A, the circular cylinder type piezoelectric element 1 is provided with a strip electrode 2a uniformly along a circumference at an upper portion of an inner peripheral face and a lower half thereof is provided with a 4 divided electrode portions (3a, 4a, 5a, 6a) divided into 4 along the circumference and formed in a direction in parallel with the center axis of the circular cylinder. Further, as shown by FIG. 2B, an upper end portion of an outer peripheral face is provided with a foldback electrode portion 2b communicated with the strip electrode portion 2a of an inner peripheral face, and a lower end portion thereof is provided with foldback electrode portions (3b, 4b, 5b, 6b) communicating with the 4 divided electrode portions (3a, 4a, 5a, 6a) of the inner peripheral face, and a portion thereof other than the foldback electrodes is formed with a single strip electrode portion 7 along the circumference. The strip electrode portion 7 is provided with a surface area which is sufficiently larger than that of other electrode of the electrodes provided at the outer peripheral face.

The electrodes are fabricated by subjecting the circular cylinder type piezoelectric element 1 to masking, fabricating an electrode having a thickness of about 3 μm by electroless nickel plating, thereafter, removing the masking.

A total length of the circular cylinder type piezoelectric element 1 is 100 mm, a diameter of an outer periphery is 20 mm, a thickness between an inner periphery and the outer periphery is 1 mm, a length of the 4 divided electrode portions (3a, 4a, 5a, 6a) is 50 mm, and a length of the strip electrode portion 2a is 45 mm.

The circular cylinder type piezoelectric element 1 is subjected to a polarization processing to have a polarity in a direction orthogonal to the center axis of the circular cylinder from the inner peripheral face in a direction of the outer peripheral face. The polarity of the polarization is provided with polarities which differ by divided electrode faces of the inner peripheral face and is provided with polarities indicated by signs of FIG. 2A. Here, a plus sign indicates a portion of being subjected to a polarization processing by bringing the strip electrode portion 7 of the outer peripheral face to a ground potential and applying a plus voltage to the inner peripheral face in carrying out the polarization, and according to the ions at inside of the element, a minus polarity is directed to the inner peripheral face. The electrode subjected to the polarization processing in this way is referred to as plus electrode. Further, a minus sign indicates a portion of being subjected to the polarization processing by bringing the strip electrode portion 7 to the ground potential and applying a minus voltage to the inner peripheral face in carrying out the polarization, and according to the ions at inside of the element, a plus polarity is directed to the inner peripheral face. The electrode subjected to the polarization processing in this way is referred to as minus electrode. All of ways of referring to polarities of electrodes in the specification follow the definition. According to the circular cylinder type piezoelectric element 1 of this embodiment, the polarization processing is carried out such that the strip electrode portion 2a of the inner peripheral face is the plus electrode and in the 4 divided circuit portions (3a, 4a, 5a, 6a), the electrodes (3a, 4a), (5a, 6a) opposed to each other relative to the center axis constitute inverse polarities.

A side of providing the strip electrode portion 2a of the inner peripheral face of the circular cylinder type piezoelectric element is defined as a front end portion, a side of providing the 4 divided electrode portions (3a, 4a, 5a, 6a) is defined as a distal end portion, a direction of the center axis is defined as Z axis, a left and right direction of a paper face orthogonal to Z axis is defined as X axis, and a direction orthogonal to the paper face is defined as Y axis.

When the circular cylinder type piezoelectric actuator is mounted to the scanning probe microscope, as shown by FIG. 1, the distal end portion of the circular cylinder type piezoelectric element 1 is fixed to a roughly moving mechanism 11, and the roughly moving mechanism 11 is fixed to a base block 12. The roughly moving mechanism 11 is constituted by a stepping motor and a feed screw mechanism, and is provided with a function of moving the circular cylinder type piezoelectric element 1 in Z axis direction. On the other hand, the front end side of the circular cylinder type piezoelectric element is fixedly attached with a sample stage 21 and a sample 20 is mounted above the sample stage 21.

Here, the strip electrode portion 7 of the outer peripheral face is connected to the ground. Further, the foldback electrode portion 2b connected to the strip electrode portion 2a of the inner peripheral face is connected with a Z axis drive power supply 8. Further, in the foldback electrode portions (3b, 4b, 5b, 6b) of the outer peripheral face connected to the 4 divided electrode portions (3a, 4a, 5a, 6a) of the inner peripheral face, the two electrode portions (3b, 4b) opposed to each other in X axis direction are connected with an X axis drive power supply 9, the two electrode portions (5b, 6b) opposed to each other in Y axis direction are connected with a Y axis drive power supply 10, and a drive voltage is applied to the 4 divided electrode portions (3a, 4a, 5a, 6a) on the inner peripheral face by way of the respective foldback electrodes (3b, 4b, 5b, 6b). Further, although it is not necessarily needed to provide the foldback electrodes (2b, 3b, 4b, 5b, 6b) and a connection may be carried out directly to the electrodes (2a, 3a, 4a, 5a, 6a) at inside thereof, by providing the foldback electrodes, electrodes for connecting the drive power supplies can be provided at outside of the circular cylinder, and therefore, the connection is facilitated. When the strip electrode portion 7 of the outer peripheral face is connected to the ground, the strip electrode portion 7 is grounded or connected to ground sides of the drive power supplies (8, 9, 10).

When a voltage is applied to the Z axis drive power supply 8 of the circular cylinder type piezoelectric actuator connected in this way, an attraction force or a repulsion force is operated to a crystal at inside of the piezoelectric element in accordance with a polarity applied, and a strain is generated in a thickness direction. A strain is also generated in Z axis direction by the strain and a displacement in Z axis direction is generated in the piezoelectric element. When a voltage of a plus polarity is applied by the Z axis drive power supply 8, a strain in a direction of increasing the thickness is generated, as a result, a displacement in a contracting direction along Z axis is generated. Conversely, when a voltage of a minus polarity is applied, a displacement is generated in an elongating direction along Z axis.

Further, when a voltage is applied to the Z axis drive power supply 9, since a polarity of an ion differs by the electrodes (3a, 4a) opposed to each other, a thickness is increased at one thereof and a thickness is reduced at other thereof. As a result, one electrode is displaced in a contracting direction and other electrode is displaced in an elongating direction in a direction in parallel with the center axis, bending in X axis direction is generated at the circular cylinder type piezoelectric actuator centering on a fixed end of the distal end and a front end carries out a circular arc movement. Here, a displacement of the circular arc movement is small, and therefore, the displacement can be regarded to be brought about in a direction in parallel with the X axis approximately. The front end can be moved in two positive and negative directions relative to the center axis by changing the polarity of the voltage of the X axis drive power supply 9. Also with regard to Y axis, the front end can be displaced in Y direction by a principle the same as that of X axis by applying the voltage to the electrodes (5a, 6a) opposed to each other by using Y axis by the power supply 10. As a result, the front end of the piezoelectric element can be moved in an arbitrary direction in XY plane by controlling the voltages applied in X axis and Y axis. According to the embodiment, the front end can be moved by 100 μm in XY plane and 10 μm in Z axis direction by driving the front end by the voltages applied to the electrodes of the respective axes in a range equal to or higher than −200 V and equal to or lower than +200 V. Here, although there may be used a circular cylinder type piezoelectric element constituting polarities of the electrodes opposed to each other of the 4 divided electrode portions (3a, 4a, 5a, 6a) of the same polarity, in this case, in order to deform to bend the circular cylinder type piezoelectric element, it is necessary to apply voltages constituting polarities inverse to each other by using two of power supplies for respective axes and in two axes of XY, a total of 4 pieces of drive power supplies are needed. By carrying out polarization such that polarities of the electrodes (3a, 4a) (5a, 6a) opposed to each other differ from each other as in the embodiment, a movement in XY face can be realized by applying voltages of the same polarity by 1 piece of the drive power supply for each axis, a total of 2 pieces thereof for 2 axes of XY.

A cantilever 17 having a stylus 18 at a front end is arranged to be fixed to a cantilever holder 19 on a side of being opposed to the sample 20.

A displacement of the cantilever 17 is measured by a displacement detecting mechanism 13 of an optical lever system constituted by a semiconductor laser 14 and a converging lens 15 and a photodetector 16.

According to the embodiment, the stylus 18 and the sample 20 are made to be proximate to each other by the roughly moving mechanism 11 up to a region of operating an atomic force, while carrying out raster scanning in a direction in parallel with a sample face by using the 4 divided electrode portions (3a, 4a, 5a, 6a) of the circular cylinder type piezoelectric actuator 1, a feedback control in a direction orthogonal to the sample face is carried out by using the strip electrode portion 2a by a signal of the displacement detecting mechanism 13 such that a distance between the stylus 18 and the sample 20 becomes constant.

A three-dimensional shape image can be measured by forming a signal applied to XY axes by the scanning probe microscope 100 constituted in this way into an image as information of a two-dimensional plane by constituting height information by a signal applied to Z axis.

According to the scanning probe microscope constituted as described above, wiring members of signals of the drive power supplies (8, 9, 10) of the circular cylinder type piezoelectric actuator 1, a signal for driving the stepping motor of the roughly moving mechanism 11, a signal for driving the semiconductor laser 12 of the displacement detecting mechanism 13, a detecting signal of a photodetector 117 and the like are connected to an outside controller (not illustrated) by using wiring members. The wiring members are wired normally to surround the circular cylinder type piezoelectric actuator 1 provided at inside of a cabinet constituting a unit of the scanning probe microscope 100.

Although according to the scanning probe microscope of the background, several hundreds V order of the high voltage is applied in order to drive the circular cylinder type piezoelectric element, and therefore, a high voltage component applied to an outside electrode of the piezoelectric element is mixed to an apparatus, wiring members and the like surrounding the surrounding as noise, according to the embodiment, the strip electrode 7 is provided at most of a region at the outermost peripheral portion, the strip electrode portion is connected to the ground potential, and therefore, the signal by the drive voltage applied to the inner peripheral face is shielded, and noise is prevented from being mixed to wiring members or parts arranged at the surrounding of the piezoelectric actuator. Further, also noise is prevented from being mixed to the electrode applied with the drive signal of the circular cylinder type piezoelectric element from wiring members or parts of the surrounding and a measurement accuracy is promoted.

Further, even when brought into contact with the electrode of the outer peripheral face of the circular cylinder type piezoelectric element, accidentally, in a case in which insulation of surrounding parts or wiring members of the circular cylinder type piezoelectric element is incomplete, since the electrode on the outer peripheral face is connected to the ground, an erroneous operation by shortcircuit, or destruction of the apparatus is prevented and a reliability is promoted.

Embodiment 2

Figure 3:
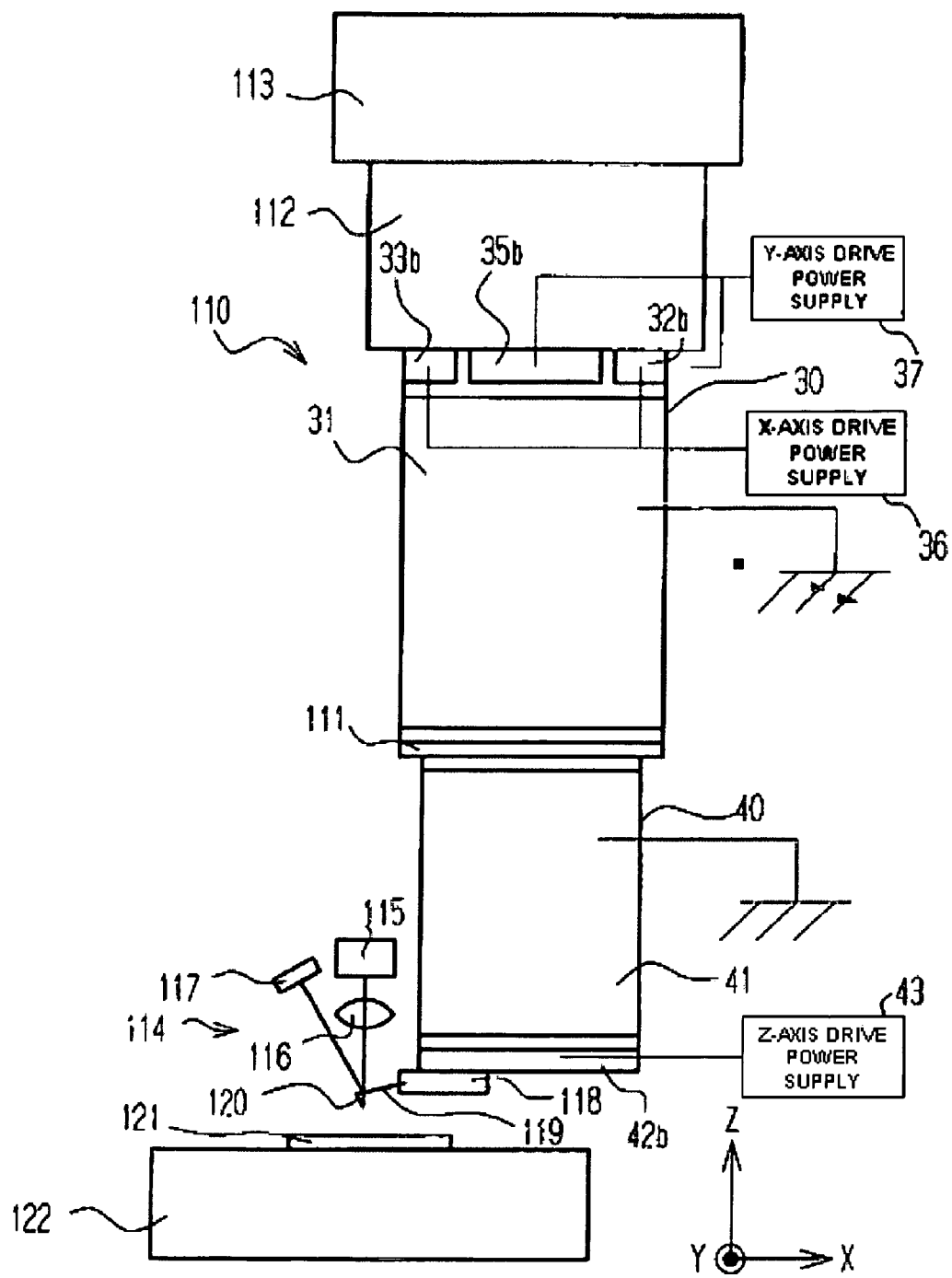
FIG. 3 is an outline view of a scanning probe microscope using a circular cylinder type piezoelectric actuator according to a second embodiment of the invention.
Figure 4A:
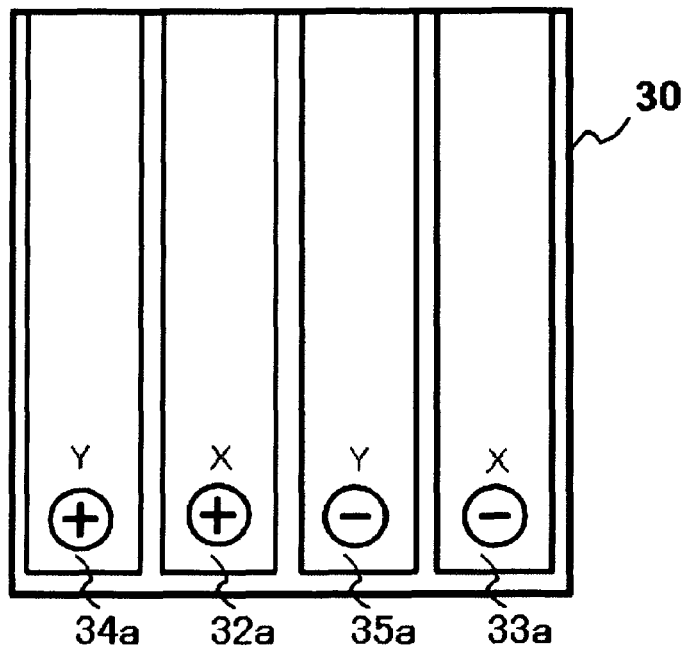
FIG. 4A is a development view of an inner peripheral face of a circular cylinder type piezoelectric element used in a horizontal direction finely moving mechanism according to the second embodiment of the invention.
Figure 4B:
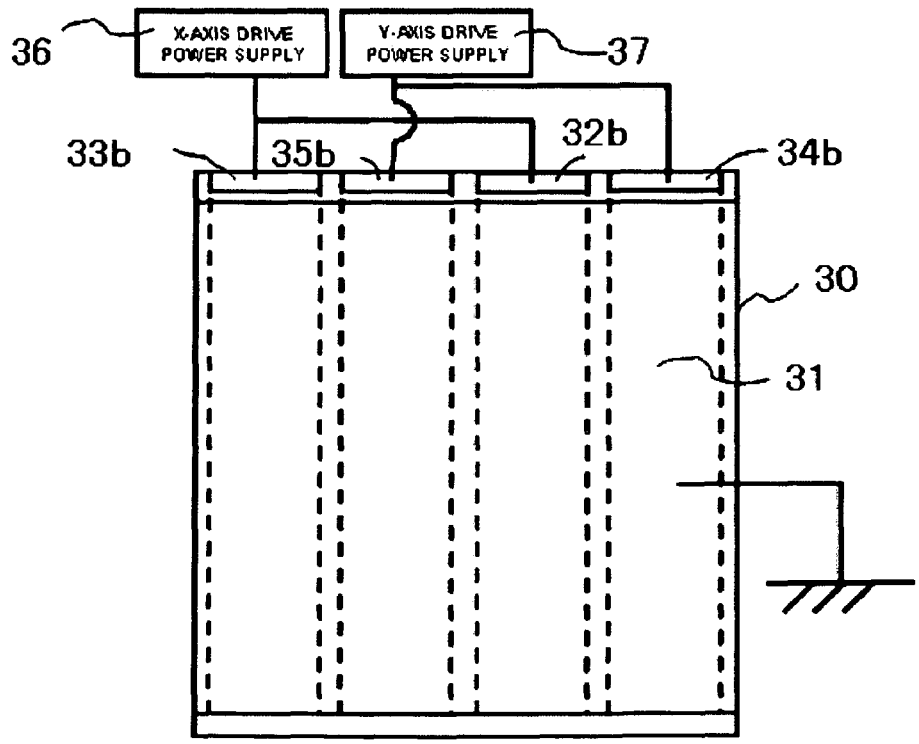
FIG. 4B is a development view of an outer peripheral face of the circular cylinder type piezoelectric element used in the horizontal direction finely moving mechanism according to the second embodiment of the invention.
Figure 5A:
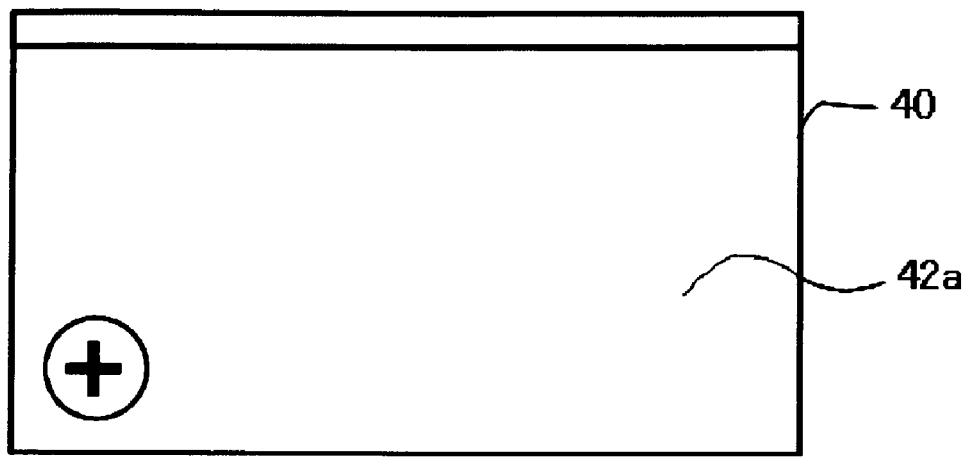
FIG. 5A is a development view of an inner peripheral face of a circular cylinder type piezoelectric element used in a vertical direction finely moving mechanism according to the second embodiment of the invention.
Figure 5B:
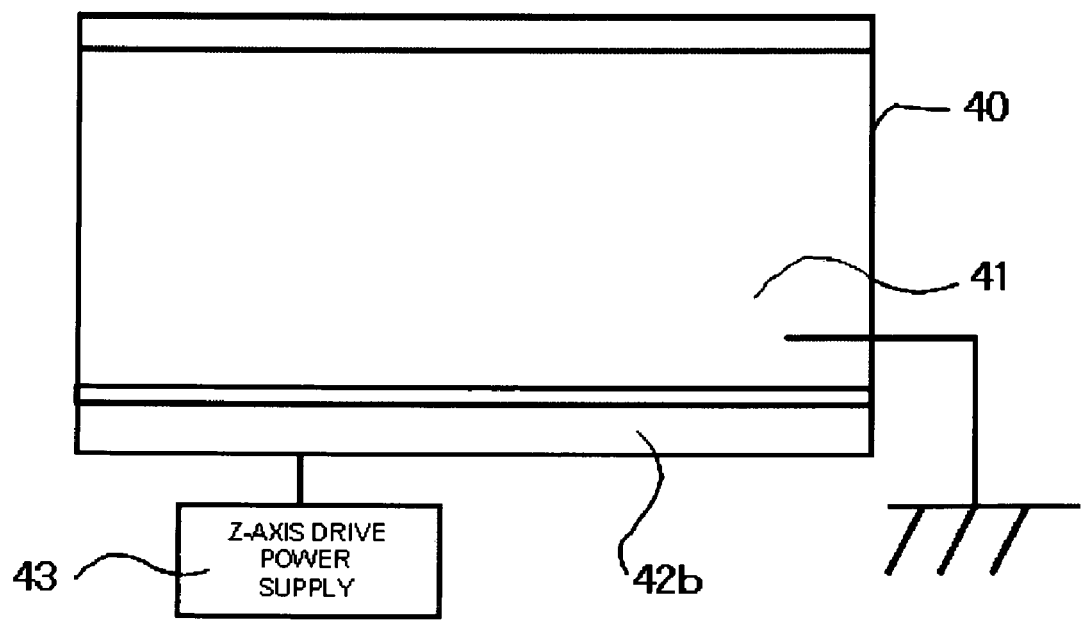
FIG. 5B is a development view of an outer peripheral face of the circular cylinder type piezoelectric element used in the vertical direction finely moving mechanism according to the second embodiment of the invention.

FIG. 3 through FIG. 5B show a scanning probe microscope using a circular cylinder type piezoelectric actuator according to a second embodiment. According to the embodiment, a horizontal direction finely moving mechanism and a vertical direction finely moving mechanism are divided by using 2 pieces of circular cylinder type piezoelectric elements, FIG. 3 is an outline view of a scanning probe microscope, FIGS. 4A and 4B are development views of a circular cylinder type piezoelectric element used as the horizontal direction finely moving mechanism in the scanning probe microscope of FIG. 3, and FIGS. 5A and 5B are development views of a circular cylinder type piezoelectric element used as the vertical direction finely moving mechanism. Further, according to the embodiment, a principle of operating the circular cylinder type piezoelectric actuator and a principle of operating the scanning probe microscope are the same as those of Embodiment 1, and therefore, a detailed explanation of common portions will be omitted.

According to a scanning probe microscope 110 of the embodiment, a 3 axes finely moving mechanism is constituted by connecting 2 pieces of circular cylinder type piezoelectric elements (30, 40) in end-to-end relationship.

As shown by FIG. 4A, the circular cylinder type piezoelectric element 30 for the horizontal direction finely moving mechanism is provided with 4 divided electrode portions (32a, 33a, 34a, 35a) divided into 4 along a circumference and formed in a direction in parallel with a center axis of a circular cylinder at an inner peripheral face. Further, as shown by FIG. 4B, an upper end portion of an outer peripheral face is provided with foldback electrode portions (32b, 33b, 34b, 35b) communicating with the 4 divided electrode portions (32a, 33a, 34a, 35a) of the inner peripheral face, and a lower side of the foldback electrode portions (32b, 33b, 34b, 35b) is provided with a strip electrode portion 31 having a surface area sufficiently larger than that of the foldback electrode portions to cover a large portion of the outer peripheral face other than the foldback electrode portions. A total length of the circular cylinder type piezoelectric element 30 is 50 mm, a diameter of an outer periphery is 20 mm, a thickness between an inner periphery and the outer periphery is 1 mm. The circular cylinder type piezoelectric element 30 is subjected to a polarization processing to provide polarities in a direction orthogonal to the center axis of the circular cylinder from the inner peripheral face in a direction of the outer peripheral face. The polarity of the polarization is provided with polarities which differ by divided electrode faces of the inner peripheral face and provided with polarities shown by signs of FIG. 4A. According to the circular cylinder type piezoelectric element 30 of the embodiment, the 4 divided electrode portions (32a, 33a, 34a, 35a) are subjected to polarization processing such that the electrodes (32a, 33a, 34a, 35a) opposed to each other relative to the center axis constitute inverse polarities.

In fabricating the electrodes of the circular cylinder type piezoelectric element 30, first, the outer peripheral face is subjected to masking in correspondence with an electrode pattern and the electrode having a thickness of about 3 µm is fabricated by electroless nickel plating. Thereafter, the electrode is formed at the outer peripheral face by removing the masking. Further, the inner peripheral face is not subjected to masking in initial electroless nickel plating and a strip electrode is formed over an entire region of the inner peripheral face. Thereafter, the 4 divided electrode portions (32a, 33a, 34a, 35a) are fabricated by cutting portions of the strip electrode by a diamond tool.

Further, as shown by FIG. 5A, the circular cylinder type piezoelectric element 4 for the vertical direction finely moving mechanism is provided with a strip electrode 42a substantially over an entire face of the inner peripheral face, and as shown by FIG. 5B, the outer peripheral face is provided with a foldback electrode 42b in a strip-like shape connected to the strip electrode 42a of the inner peripheral face, and a strip electrode portion 41 having a surface area sufficiently larger than that of the foldback electrode portion and covering most of the outer peripheral face other than the foldback electrode portion.

A total length of the circular cylinder type piezoelectric element 40 is 60 mm, a diameter of an outer periphery is 18 mm, and a thickness between an inner periphery and an outer periphery is 1 mm. The circular cylinder type piezoelectric element 40 is subjected to a polarization processing to provide a polarity in a direction orthogonal to a center axis of the circular cylinder from the inner peripheral face in the direction of the outer peripheral face. The polarity of polarization is subjected to the polarization processing such that the strip electrode portion 42a of the inner peripheral face is provided with a plus polarity.

According to the circular cylinder type piezoelectric element 30 for the horizontal direction finely moving mechanism and the circular cylinder type piezoelectric element 40 for the vertical direction finely moving mechanism, the horizontal direction finely moving mechanism 30 is arranged at the distal end, the vertical direction finely moving mechanism 40 is arranged at the front end, the mechanism 30 and the mechanism 40 are connected in end-to-end relationship by a connecting member 111 formed by an insulating material of ceramics such that respective center axes thereof coincide with each other to constitute a three-dimensional finely moving mechanism.

The distal end of the 3 axes finely moving mechanism is connected to a Z axis roughly moving mechanism 112 constituted by a stepping motor and a feed screw and the Z axis roughly moving mechanism 112 is fixed to a base 113.

Further, the front end of the 3 axes finely moving mechanism is attached with a cantilever holder 118 for fixing a cantilever 119 having a stylus 120 at a front end thereof, further, provided with a displacement detecting mechanism 114 constituted by a semiconductor laser 115 and a converging lens 116 and a photodetector 117 for detecting a displacement of the cantilever 119. According to the embodiment, the cantilever holder 118 is attached with a piezoelectric element (not illustrated) for oscillating the cantilever for carrying out a measurement by the vibration system.

A sample 121 is arranged at a position of being opposed to the stylus 120. The sample 121 is mounted on an XY stage 122 driven by a stepping motor for specifying a measured position.

Although according to Embodiment 1, the side of the sample is scanned, according to the embodiment, the side of the cantilever 119 is scanned.

Here, the strip electrode portions (31, 41) disposed at outer peripheral faces of the horizontal direction finely moving mechanism 30 and the vertical direction finely moving mechanism 40 are connected to a ground potential. Although in FIG. 3, the strip electrode portions (31, 41) are respectively connected directly to ground electrodes, either one of the electrodes may be connected to the ground potential by connecting the strip electrode portions (31, 41) by a lead wire.

Further, the 4 divided electrode portions (32a, 33a, 34a, 35a) of the inner peripheral face of the horizontal direction finely moving mechanism 30 are connected to an X axis drive power supply 36 and a Y axis power supply 37 by way of the 4 divided electrode portions (32b, 33b, 34b, 35b) of the outer peripheral face.

Further, the strip electrode portion 42a of the inner peripheral face of the vertical direction finely moving mechanism 40 is connected to a Z axis drive power supply 43 by way of the foldback strip electrode portion 42b of the outer peripheral face.

Further, the 4 divided electrode portions (32b, 33b, 34b, 35b) and the strip electrode portion 42b of the outer peripheral faces are provided in consideration of operability of soldering in wiring, and the electrodes are not indispensable but the respective drive power supplies (36, 37, 43) may directly be connected to the 4 divided electrode portions (32a, 33a, 34a, 35a) and the strip electrode portion 42a of the inner peripheral faces.

By respectively separately fabricating the horizontal direction finely moving mechanism 30 and the vertical direction finely moving mechanism 40 as in the embodiment, fabrication of the electrodes of the inner peripheral faces can easily be carried out.

According to the scanning probe microscope constituted as described above, the strip electrodes (31, 41) are provided at most of regions of the outermost peripheral portions of the circular cylinder type piezoelectric actuators (30, 40), the electrodes are connected to the ground potential, and therefore, a signal by the drive voltage applied to the inner peripheral face is shielded, and noise can be prevented from being mixed to a wiring member or a part arranged at a surrounding of the piezoelectric actuator. Further, also noise is prevented from being mixed to the electrode of the inner peripheral face applied with the drive signal of the circular cylinder type piezoelectric element from a surrounding wiring member or part and a measurement accuracy is promoted.

Further, even when brought into contact with the electrode of the outer peripheral face of the circular cylinder type piezoelectric element, accidentally, in a case in which insulation of a part or a wiring member at a surrounding of the circular cylinder type piezoelectric element is incomplete, since the electrode of the outer peripheral face is grounded, an erroneous operation by a shortcircuit or destruction of the apparatus is prevented and reliability is promoted.

Embodiment 3

Figure 7:
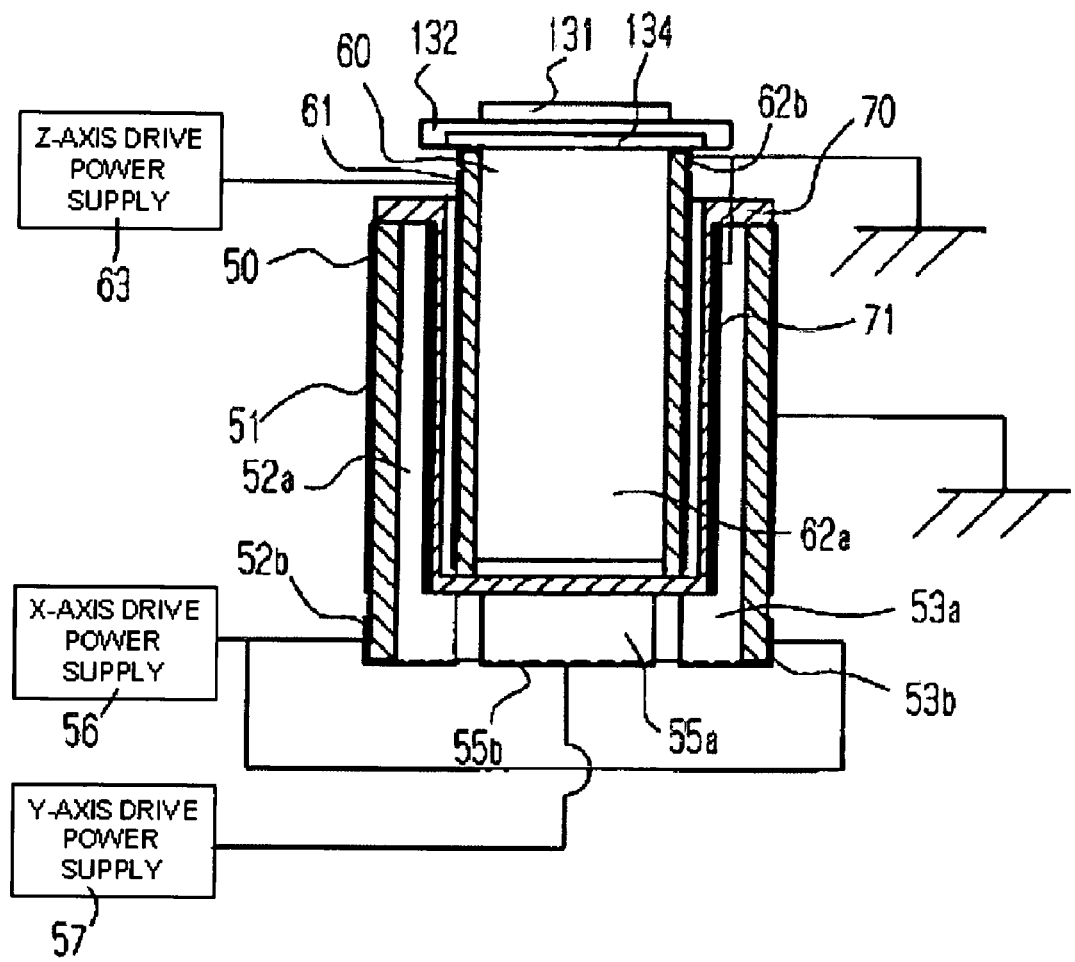
FIG. 7 is a sectional view taken along a line A-A of FIG. 6.

FIG. 6 and FIG. 7 show a scanning probe microscope using a circular cylinder type piezoelectric actuator according to a third embodiment of the invention. According to the embodiment, a horizontal direction finely moving mechanism and a vertical direction finely moving mechanism are constituted to be divided and a 3 axes finely moving mechanism is constituted by connecting 2 pieces of circular cylinder type piezoelectric actuators in a shape of a concentric circles.

FIG. 6 is an outline view of a scanning probe microscope, and FIG. 7 is a sectional view taken along a line A-A of FIG. 1. Further, also in the embodiment, a principle of operating a circular cylinder type piezoelectric actuator and a principle of operating a scanning probe microscope are the same as those of Embodiment 1, and therefore, a detailed explanation of common portions will be omitted.

According to a scanning probe microscope 120 of the embodiment, a 3 axes finely moving mechanism is constituted by using 2 pieces of circular cylinder type piezoelectric elements (50, 60) nested one within the other.

A circular cylinder type piezoelectric element 50 for the horizontal direction finely moving mechanism is provided with 4 divided electrode portions (52a, 53a, 54a, 55a) divided into 4 along a circumference and formed in a direction in parallel with a center axis of a circular cylinder at an inner peripheral face. Further, a lower end portion of an outer peripheral face is provided with foldback electrode portions (52b, 53b, 54b, 55b) communicating with the 4 divided electrode portions (52a, 53a, 54a, 55a) of the inner peripheral face, and an upper side of the foldback electrode portions (52b, 53b, 54b, 55b) is provided with a strip electrode portion 51 having a surface area sufficiently larger than that of the foldback electrode portions to cover most of the outer peripheral face other than the foldback electrode portions. A total length of the circular cylinder type piezoelectric element 50 is 50 mm, a diameter of an outer periphery is 40 mm, and a thickness between an inner periphery and the outer periphery is 1 mm. The circular cylinder type piezoelectric element 50 is subjected to a polarization processing to provide a polarity in a direction orthogonal to the center axis of the circular cylinder from the inner peripheral face in a direction of the outer peripheral face. The circular cylinder type piezoelectric element 50 is subjected to the polarization processing such that the polarity of the polarization is provided with polarities which differ by divided electrode faces of the inner peripheral face and electrodes (52a, 53a), (54a, 55a) opposed to each other relative to the center axis are provided with polarities inverse to each other.

Further, the circular cylinder type piezoelectric element 60 for the vertical direction finely moving mechanism is provided with a strip electrode 62a over substantially an entire face of the inner peripheral face, and an outer peripheral face is provided with a foldback electrode 62b in a strip-like shape connected to the strip electrode 62a of the inner peripheral face, and a strip electrode portion 61 having a surface area sufficiently larger than that of the foldback electrode portion and covering most of the outer peripheral face other than the foldback electrode portion.

A total length of the circular cylinder type piezoelectric element 60 is 60 mm, a diameter of an outer periphery is 20 mm, and a thickness between the inner periphery and the outer periphery is 1 mm. The circular cylinder type piezoelectric element 60 is subjected to a polarization processing to provide a polarity in a direction orthogonal to a center axis of a circular cylinder from the inner peripheral face in a direction of the outer peripheral face. The circular cylinder type piezoelectric element 60 is subjected to the polarization processing such that with regard to the polarity of the polarization, the strip electrode portion 61 of the outer peripheral face is provided with a plus polarity.

According to the circular cylinder type piezoelectric element 50 for the horizontal direction finely moving mechanism and the circular cylinder type piezoelectric element 60 for the vertical direction finely moving mechanism, the horizontal direction finely moving mechanism 50 is arranged at the outer periphery, the vertical direction finely moving mechanism 60 is arranged at the inner periphery, the mechanisms nested one within the other and are arranged in a shape of concentric circles such that the respective center axes coincide with each other, and connected by a connecting member 70 formed by an insulating material of ceramics in a cylinder shape and having a flange to constitute the 3 axes finely moving mechanism.

According to the connecting member 70, the flange portion is fixedly attached to a front end of the horizontal direction finely moving mechanism 50 and a bottom face of an inner peripheral face thereof is fixedly attached with a distal end of the vertical direction finely moving mechanism 60.

Further, an outer peripheral face of the connecting member 70 is provided with a strip electrode 71 by electroless nickel plating over an entire face thereof.

The distal end of the 3 axes finely moving mechanism constituted in this way is connected to a Z axis roughly moving mechanism 121 constituted by a stepping motor and a feed screw, and the Z axis roughly moving mechanism 121 is fixed to a base 122.

Further, the front end of the vertical direction finely moving mechanism 60 of the 3 axes finely moving mechanism is provided with a sample holder 132 fabricated by a conductive metal by way of an insulating member 134, and a sample 131 is mounted on a sample holder 132.

At a position opposed to the sample, a cantilever holder 130 for fixing a cantilever 128 having a stylus 129 at a front end thereof is attached, further, a displacement detecting mechanism 123 constituted by a semiconductor laser 124 and a converging lens 125 and a photodetector 126 is provided for detecting a displacement of the cantilever 128. According to the embodiment, in order to measure a current distribution of a surface of a sample, a bias current is constituted to be able to apply to the sample holder 131, and the stylus 129 is connected to a current/voltage converting amplifier 133 by way of the cantilever holder 130.

Here, the strip electrode portion 51 of the outer peripheral face of the horizontal direction finely moving mechanism 50 is connected to the ground. The 4 divided electrode portions (52a, 53a, 54a, 55a) of the inner peripheral face are connected to an X axis drive power supply 56 and a Y axis drive power supply 57 by way of the 4 divided electrode portions (52b, 53b, 54b, 55b) of the outer peripheral face.

Further, the strip electrode portion 61 disposed at the outer peripheral face of the vertical direction finely moving mechanism 60 is connected to a Z axis drive power supply 63, and the strip electrode portion 62a of the inner peripheral face is connected to the ground by way of the foldback electrode portion 62b of the outer peripheral face.

Further, also the strip electrode portion 71 of the outer peripheral face of the connecting member 70 is connected to the ground.

According to the embodiment, in order to measure the small and weak current distribution of the surface of the sample, a counter measure against electric noise with regard to a measured signal needs to be carried out further strictly.

According to the embodiment, the strip electrode portion 51 of the horizontal direction finely moving mechanism 50 disposed at the outermost periphery of the 3 axes finely moving mechanism is connected to the ground, and therefore, with regard to parts or wirings at a surrounding of the 3 axes finely moving mechanism, influences of noise to each other can be restrained. Further, although with regard to the vertical direction finely moving mechanism 60 arranged at inside of the horizontal direction finely moving mechanism 50, according to the embodiment, the strip electrode 61 of the outer peripheral face is connected not to the ground but to the Z axis drive power supply 63, the strip electrode 71 provided at the outer peripheral face of the connecting member 70 is connected to the ground, and therefore, noise is shielded by the electrode, and between the electrode of the horizontal direction finely moving mechanism 50 and the electrode of the vertical direction finely moving mechanism 60, influences of noise to each other can be restrained.

Further, the foldback electrode portion 62b at a portion of the front end portion of the vertical direction finely moving mechanism 60 bonded to the sample stage 132 is connected to the ground, and therefore, a noise component by a drive signal of the vertical direction finely moving mechanism 60 is shielded and an influence of noise to an electric circuit for measuring a current can be restrained.

Further, although according to the embodiment, in order to achieve an effect of shielding the foldback electrode portion 62b, the Z axis drive power supply 63 of the vertical direction finely moving mechanism 60 is connected to the strip electrode 61 of the outer peripheral face of the circular cylinder type piezoelectric element, depending on a situation of noise, the strip electrode 61 of the outer peripheral face may be connected to the ground and the Z axis drive power supply 63 may be connected to the strip electrode portion 62a of the inner peripheral face.

Embodiment 4

Figure 8A:
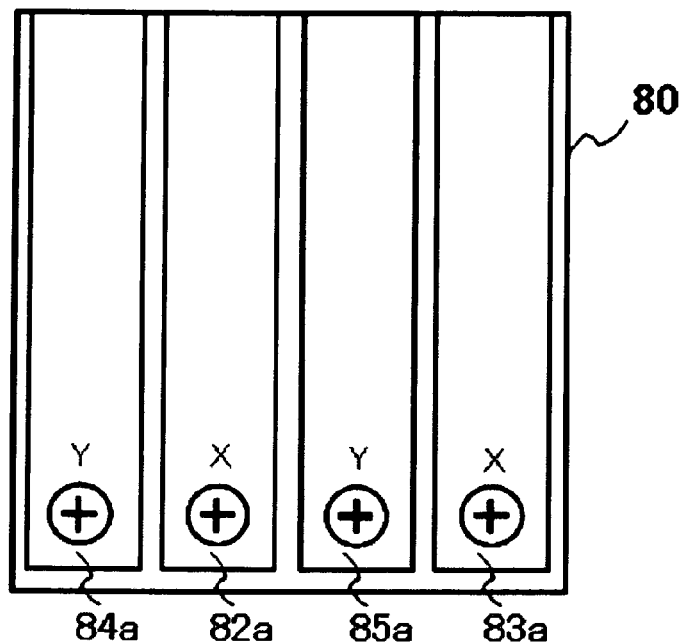
FIG. 8A is a development view of an inner peripheral face of a circular cylinder type piezoelectric element according to a fourth embodiment of the invention.
Figure 8B:
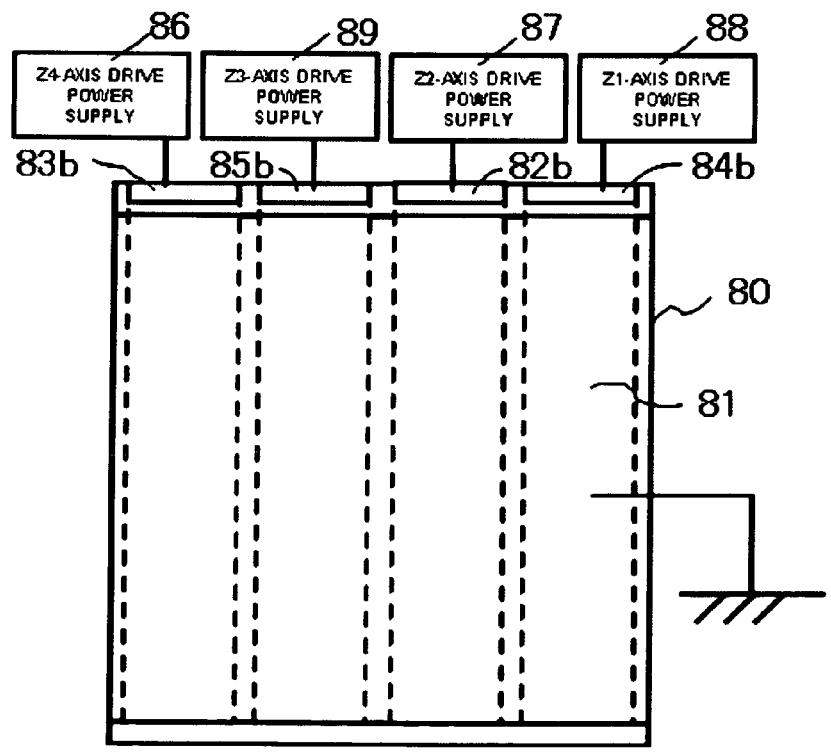
FIG. 8B is a development view of an outer peripheral face of the circular cylinder type piezoelectric element according to the fourth embodiment of the invention.

FIGS. 8A and 8B show development views of the circular cylinder type piezoelectric actuator according to a fourth embodiment of the invention. FIG. 8A is a development view of an inner peripheral face and FIG. 8B is a development view of an outer peripheral face.

A circular cylinder type piezoelectric actuator 80 of the embodiment is an actuator driven at inside of a two-dimensional plane orthogonal to a center axis. An inner peripheral face is divided into 4 along a circumference and 4 divided electrode portions (82a, 83a, 84a, 85a) are provided in a direction in parallel with the center axis. Polarization is carried out such that all of the respective electrodes (82a, 83a, 84a, 85a) are plus electrodes having the same polarity. Further, an outer peripheral face is provided with foldback electrode portions (82b, 83b, 84b, 85b) connected to the 4 divided electrode portions (82a, 83a, 84a, 85a) of the inner peripheral face and a strip electrode portion 81.

The 4 divided electrode portions (82a, 83a, 84a, 85a) are alternately connected with X axis drive power supplies (86, 87) and Y axis drive power supplies (88, 89) by way of the foldback electrode portions (82b, 83b, 84b, 85b) of the outer peripheral face. Further, the strip electrode portion 81 of the outer peripheral face is connected to the ground potential.

According to the embodiment, respective axes are applied with voltages of phases inverse to each other by using 2 power supplies (86, 87) (88, 89) and bending is generated relative to the center axis and a front end is driven within a two-dimensional plane.

Also according to the embodiment, the electrode having the largest surface area of the outer peripheral face is connected to the ground, and therefore, influences of noise to each other can be restrained with regard to the apparatus or wiring members at a surrounding of the circular cylinder type piezoelectric element, an erroneous operation by shortcircuit or destruction of the apparatus can be prevented and a reliability is promoted.

Embodiment 5

Figure 9A:
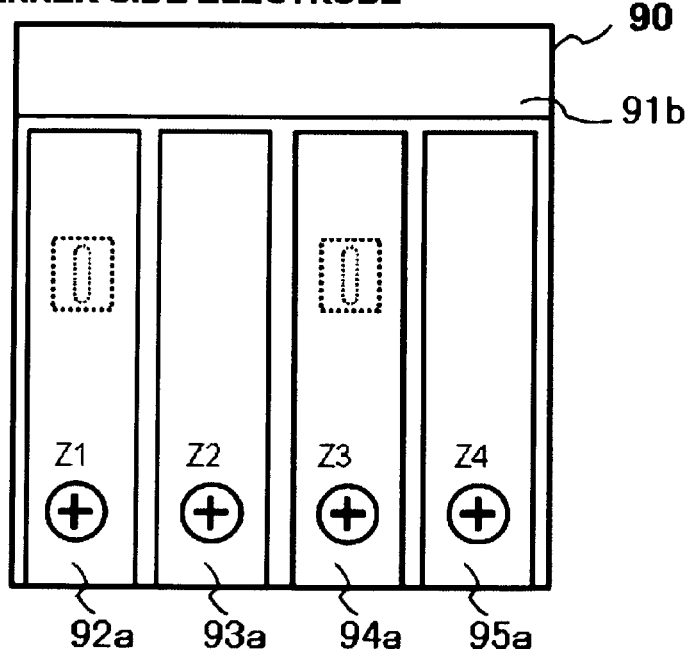
FIG. 9A is a development view of an inner peripheral face of a circular cylinder type piezoelectric element according to a fifth embodiment of the invention.
Figure 9B:
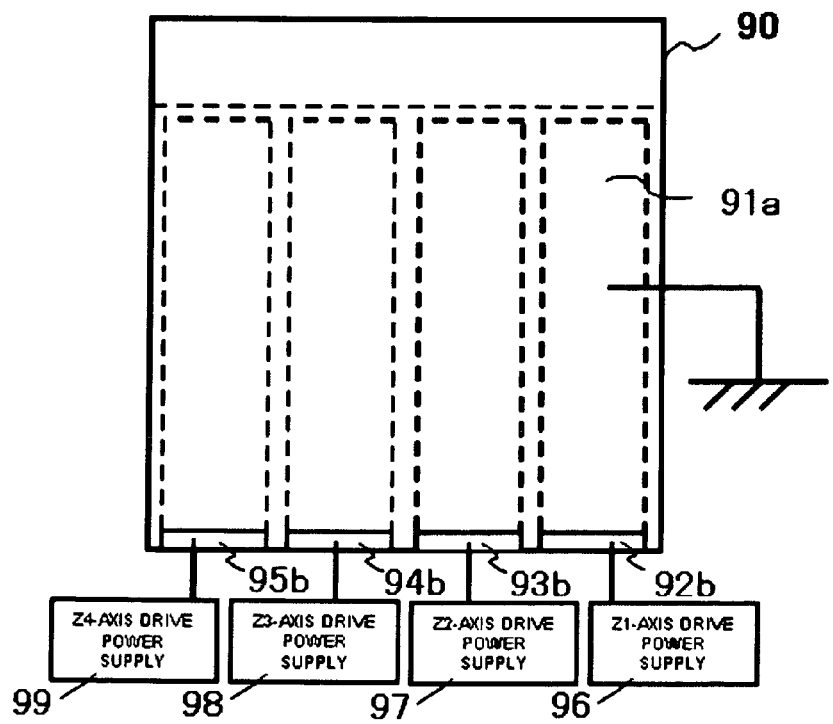
FIG. 9B is a development view of an outer peripheral face of the circular cylinder type piezoelectric element according to the fifth embodiment of the invention.

FIGS. 9A and 9B show a circular cylinder type piezoelectric actuator 90 according to a fifth embodiment of the invention. FIG. 9A is a development view of an inner peripheral face and FIG. 9B is a development view of an outer peripheral face.

The circular cylinder type piezoelectric actuator 90 of the embodiment is an actuator for generating a displacement in a direction in parallel with a center axis. An inner peripheral face is provided with a foldback electrode portion 91b in a strip-like shape connected to a strip electrode portion 91a of an outer peripheral face at an upper end portion thereof, and provided with 4 divided electrode portions (92a, 93a, 94a, 95a) divided into 4 along a circumference and formed in the direction in parallel with the center axis on a lower side thereof. Polarization is carried out such that all of respective electrodes of the 4 divided electrode portions (92a, 93a, 94a, 95a) are plus electrodes having the same polarity. Further, an outer peripheral face is provided with foldback electrode portions (92b, 93b, 94b, 95b) connected to the 4 divided electrode portions (92a, 93a, 94a, 95a) of the inner peripheral face and the strip electrode portion 91a.

The 4 divided electrode portions (92a, 93a, 94a, 95a) are connected with Z axis drive power supplies (96, 97, 98, 99) by way of the foldback electrode portions (92b, 93b, 94b, 95b) of the outer peripheral face piece by piece for the respective electrodes. Further, the strip electrode portion 91a of the outer peripheral face is connected to the ground potential.

According to the embodiment, voltages having the same polarity and the same magnitude are applied from the respective Z drive power supplies (96, 97, 98, 99) connected to the 4 divided electrode portions (92a, 93a, 94a, 95a). Strains in the same direction are generated at piezoelectric elements of the respective electrode portions (92a, 93a, 94a, 95a), and the piezoelectric actuator 90 can be driven in the direction in parallel with center axis. Here, there is a case in which owing to the working accuracies of the piezoelectric elements, even when the same voltage is applied thereto, the piezoelectric elements are not operated completely in parallel with the center axis. In such a case, an amount of deviation can be corrected by adjusting voltages applied to the 4 divided electrode portions (92a, 93a, 94a, 95a) and a linear advancing performance is ensured.

Embodiment 6

Figure 10A:
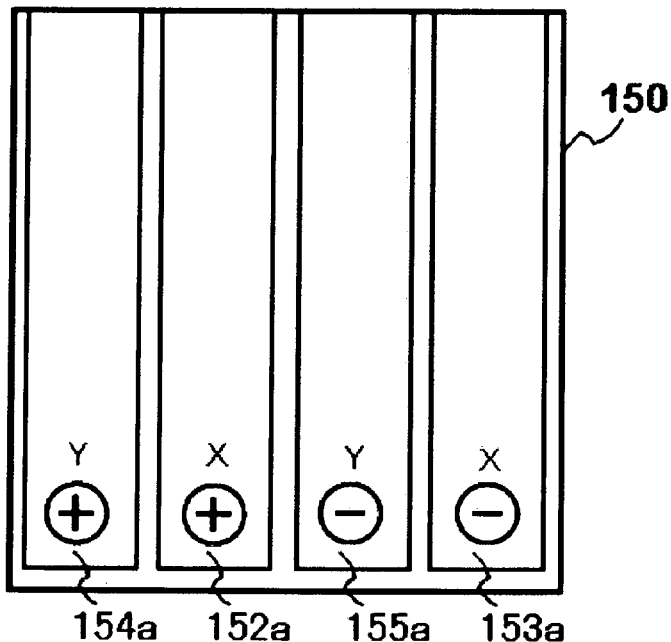
FIG. 10A is a development view of an inner peripheral face of a circular cylinder type piezoelectric element according to a sixth embodiment of the invention.
Figure 10B:
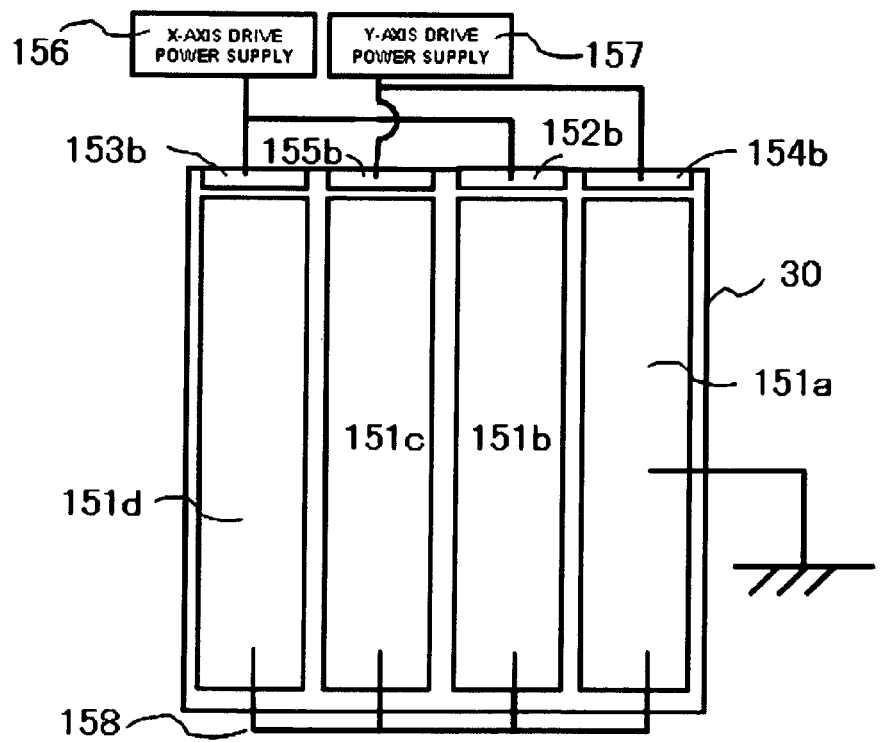
FIG. 10B is a development view of an outer peripheral face of the circular cylinder type piezoelectric element according to the sixth embodiment of the invention.
Figure 11:
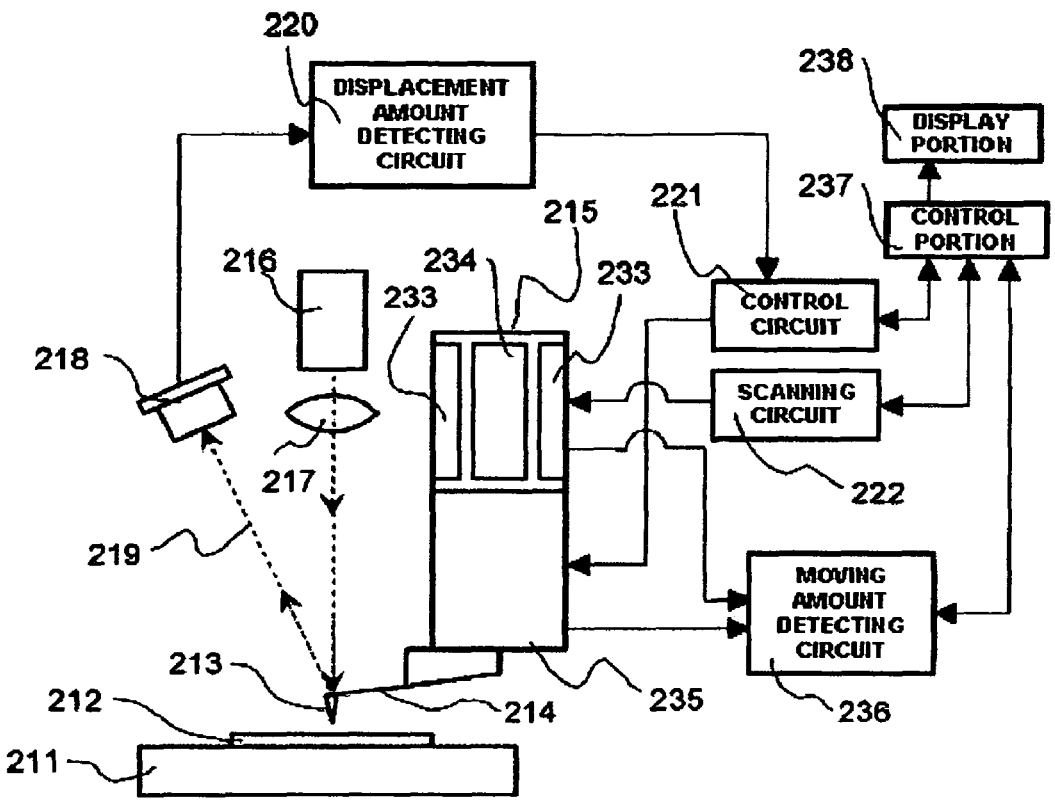
FIG. 11 is an outlook view of a scanning probe microscope using a circular cylinder type piezoelectric actuator of a background art.
Figure 12:
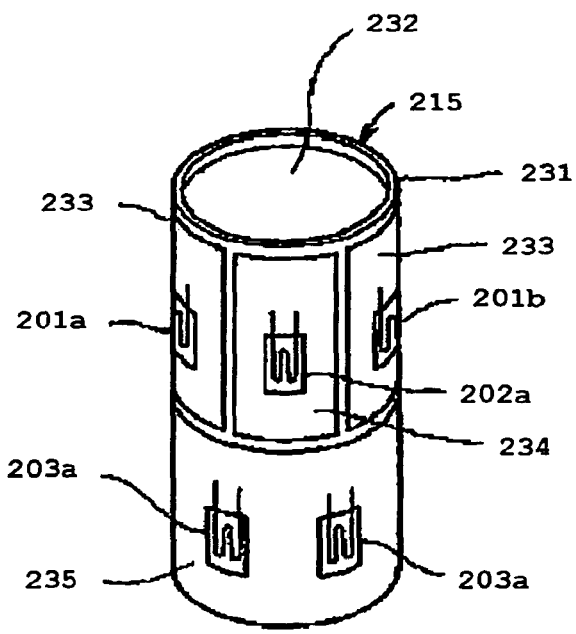
FIG. 12 is an outline view of the circular cylinder type piezoelectric actuator used in the scanning probe microscope of FIG. 11.
Figure 13:
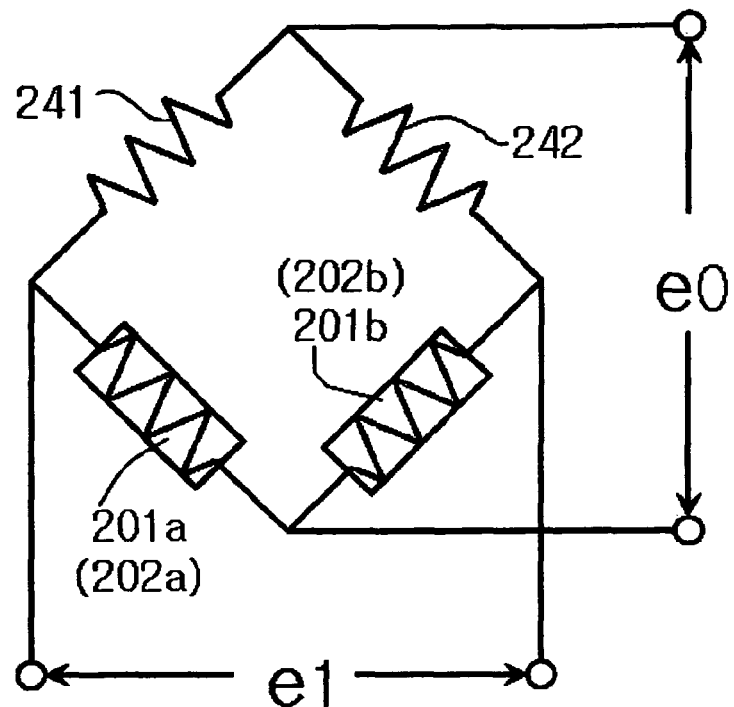
FIG. 13 is a circuit diagram used in detecting a displacement in a horizontal direction of a strain gage used in a circular cylinder type piezoelectric actuator of FIG. 12.
Figure 14:
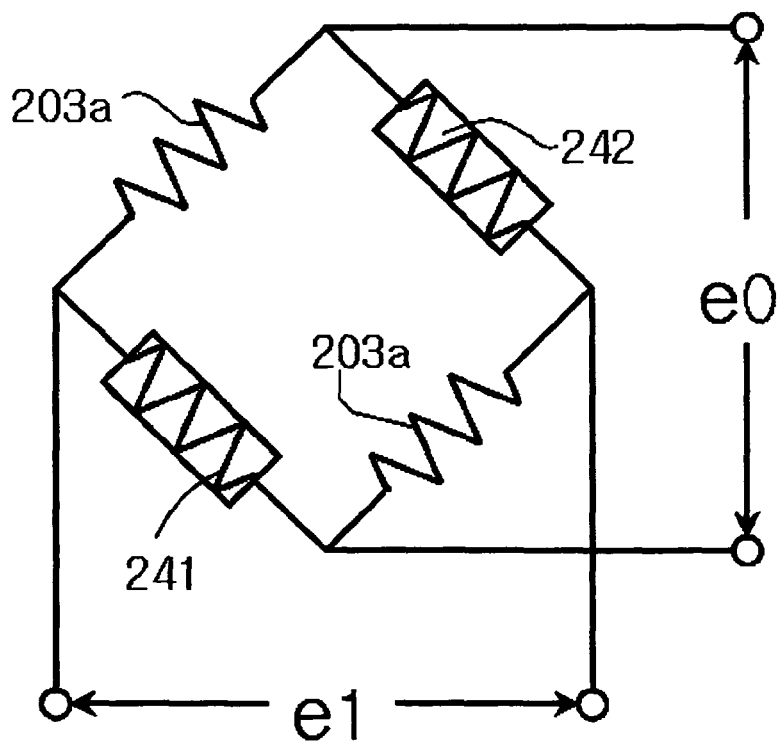
FIG. 14 is a circuit diagram used in detecting a displacement in a vertical direction of the strain gage used in the circular cylinder type piezoelectric actuator of FIG. 12.
Figure 15:
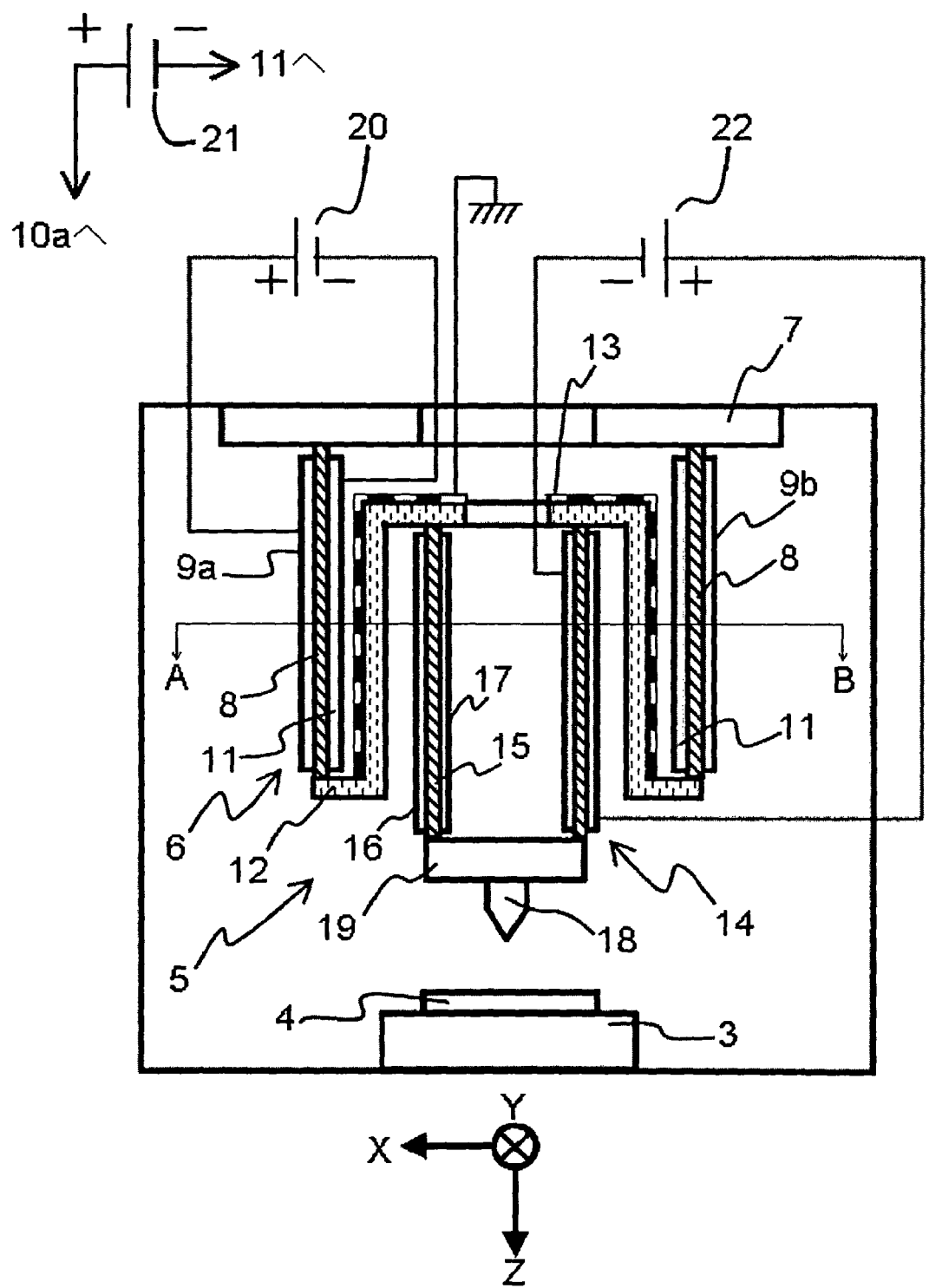
FIG. 15 is an outlook view of a scanning probe microscope using a circular cylinder type piezoelectric actuator of a background art.
Figure 16:
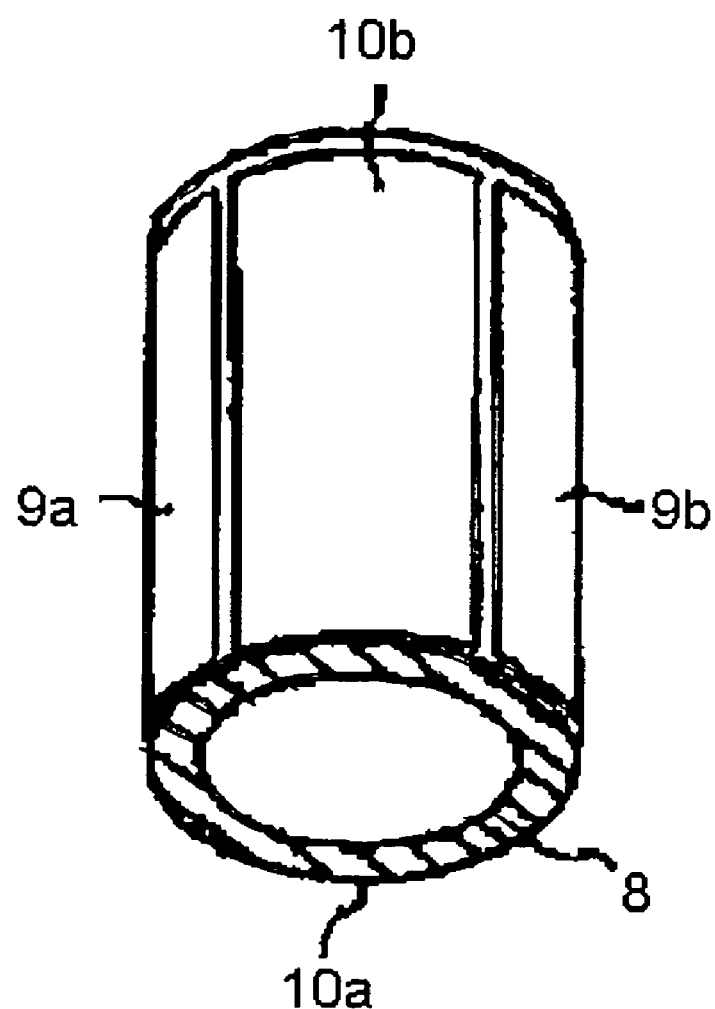
FIG. 16 is a perspective view of a circular cylinder type piezoelectric element used in the scanning probe microscope of FIG. 15.
Figure 17:
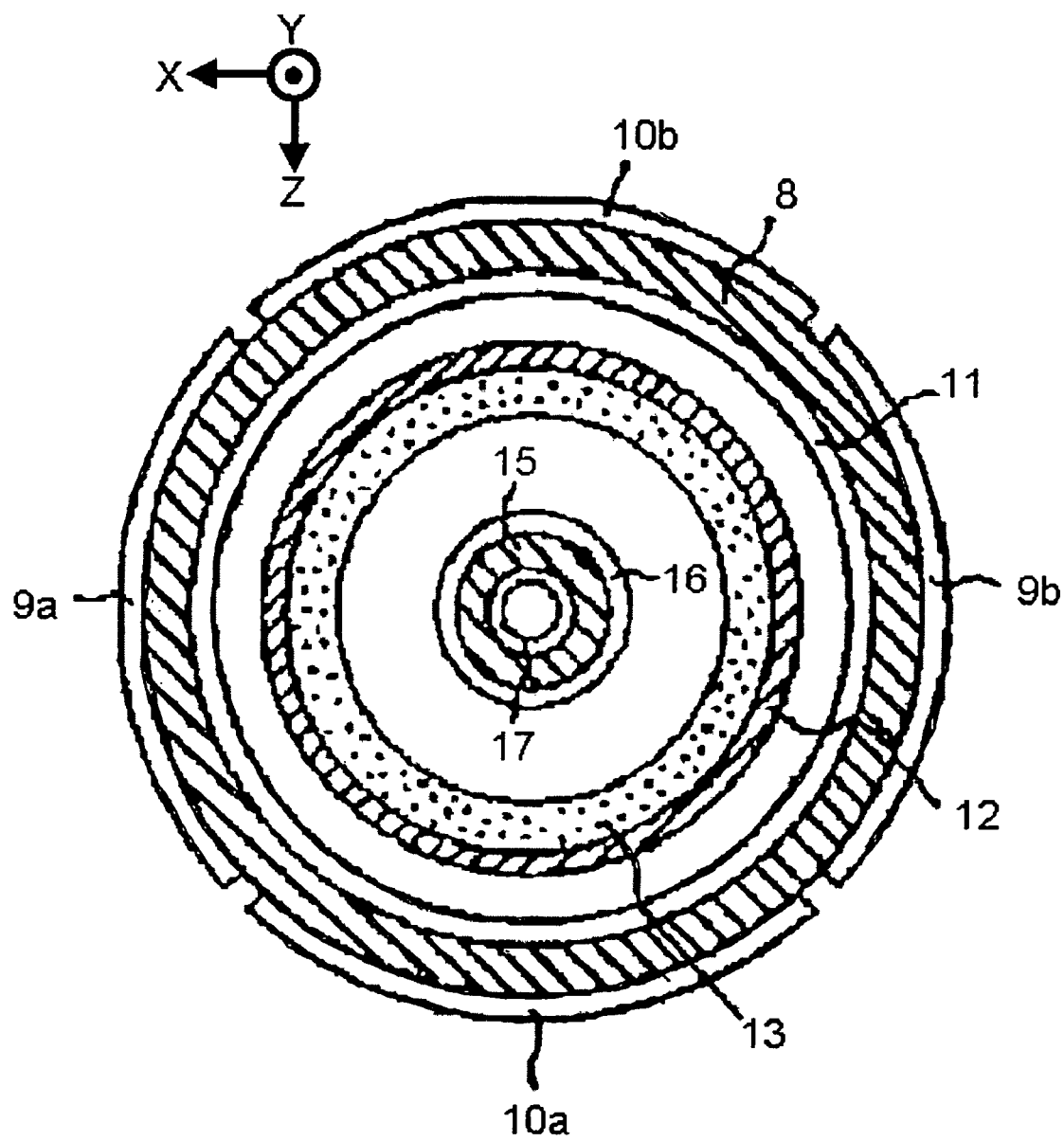
FIG. 17 is a sectional view taken along a line B-B of FIG. 15.

FIGS. 10A and 10B show a circular cylinder type piezoelectric actuator 150 according to a sixth embodiment. FIG. 10A is a development view of an inner peripheral face and FIG. 10B is a development view of an outer peripheral face. The circular cylinder type piezoelectric actuator 150 of the embodiment is an actuator driven in a two-dimensional plane orthogonal to a center axis. The inner peripheral face is divided into 4 along a circumference and is provided with 4 divided electrode portions (152a, 153a, 154a, 155a) in a direction in parallel with the center axis. The respective electrodes (152a, 153a, 154a, 155a) are subjected to polarization such that the electrodes opposed to each other relative to the center axis are provided with polarities different from each other.

The outer peripheral face is provided with foldback electrode portions (152b, 153b, 154b, 155b) connected to the 4 divided electrode portions (152*a*, 153*a*, 154*a*, 155*a*) of the inner peripheral face as well as 4 divided electrode portions (151*a*, 151*b*, 151*c*, 151*d*) divided into 4 along a circumference of the outer peripheral face in a direction in parallel with the center axis.

According to the 4 divided electrode portions (152*a*, 153*a*, 154*a*, 155*a*), an X axis drive power supply 156 and a Y axis drive power supply 157 are connected to the two electrodes respectively opposed to each other relative to the center axis by way of the foldback electrode portions (152*b*, 153*b*, 154*b*, 155*b*) of the outer peripheral face. Further, the 4 divided electrode portions (151*a*, 151*b*, 151*c*, 151*d*) of the outer peripheral face are connected by a copper wire 158 to electrically conduct the respective electrodes and are further connected to a ground potential. The 4 divided electrode portions (151*a*, 151*b*, 151*c*, 151*d*) connected by the copper wire occupy most of a region of the outer periphery and a total of a surface area thereof is a surface area sufficiently larger than that of the remaining respective electrodes (152*b*, 153*b*, 154*b*, 155*b*) of the outer periphery.

That is, although the 4 divided electrode portions (151*a*, 151*b*, 151*c*, 151*d*) are divided in view of depth thereof, when viewed electrically, the electrode portions are provided with a function equivalent to that of the strip electrode covering the outer peripheral face.

According to the embodiment, voltages are applied by 2 power supplies (156, 157), bending is generated relative to the center axis, and a front end is driven in a two-dimensional plane.

Here, an explanation will be given of steps in case of fabricating the circular cylinder type piezoelectric element of the embodiment. First, the piezoelectric element is formed in a circular cylinder type. Next, masking is carried out to constitute shapes of electrodes of the 4 divided electrode portions (151*a*, 151*b*, 151*c*, 151*d*) and the foldback electrode portions (152*b*, 153*b*, 154*b*, 155*b*) of a final mode at the outer peripheral face and the electrodes are fabricated by electroless nickel plating (including electrode pattern at an end face). At the same time, the strip electrode is fabricated at the inner peripheral face. Next, the strip electrode of the inner peripheral face is connected to the ground, and a polarization processing is carried out by connecting power supplies having polarities in correspondence with polarities of the final mode to the 4 divided electrode portions (151*a*, 151*b*, 151*c*, 151*d*) of the outer peripheral face. Thereafter, the power supplies for the polarization are removed, finally, a portion of the strip electrode in the inner peripheral face is removed by mechanical working and the 4 divided electrode portions (152*a*, 153*a*, 154*a*, 155*a*) are fabricated at the inner peripheral face.

By fabricating in this way, when the electrodes of the inner peripheral face are fabricated by mechanical working, a polarization step can be carried out before the mechanical working. Therefore, by carrying out additional steps in fabricating the piezoelectric element provided with the 4 divided electrode portions at an outer periphery of a background art, steps of the background art can be utilized as they are.

Also in the embodiment, the electrodes of almost all of the region of the outer peripheral face are connected to the ground, and therefore, with regard to the apparatus or wiring members at a surrounding of the circular cylinder type piezoelectric element, influences of noise to each other can be restrained, also an erroneous operation by shortcircuit or destruction of the apparatus can be prevented and a reliability is promoted.

Although the embodiments of the invention have been described, the invention is not limited to the embodiments.

With regard to the shape of the electrode of the circular cylinder type piezoelectric actuator, an electrode having an arbitrary shape can be used so far as a portion of an electrode arranged at the outermost periphery having the largest surface area is connected to the ground.

Further, a piezoelectric actuator of a compound type is not limited only to a combination of 2 pieces of circular cylinder type piezoelectric elements as in the second or the third embodiment but a combination of an arbitrary number of pieces can be carried out. Further, also a method of connection is not limited to that of directly connecting circular cylinder type piezoelectric elements as described in the embodiment but a constitution of connecting output ends of a plurality of circular cylinder piezoelectric elements by a sample stage and the like are included in the invention.

Further, creep or hysteresis of a piezoelectric element may be compensated for by providing a resistance member at an electrode connected to the ground of an outer peripheral face of a circular cylinder type piezoelectric actuator and detecting a displacement by a change in a resistance value. Further, a displacement may be detected by arranging not the resistance member but an electrostatic capacitance sensor or an optical sensor, a magnetic sensor or the like at a surrounding of a circular cylinder type piezoelectric actuator. Although when the displacement detecting apparatus is used, although there are cases in which noise of the displacement detecting apparatus is increased or the displacement detecting apparatus are erroneously operated by an influence of a drive power supply of the circular cylinder type piezoelectric actuator, a measurement accuracy is considerably promoted by connecting an electrode at the outermost periphery to the ground.

Further, when used in vacuum, discharge can also be prevented.

Further, as a method of fabricating an electrode, other than electroless nickel plating introduced in the embodiment, an arbitrary method of vapor deposition, sputtering or coating of a conductive paste or the like can be used. As a material of an electrode, other than nickel, an arbitrary conductive material of silver, gold, copper or the like can be used.

Further, a positioning apparatus utilizing the circular cylinder type piezoelectric actuator of the invention is applicable to various apparatus of, for example, an optical microscope, a laser microscope, a semiconductor fabricating apparatus, a semiconductor inspecting apparatus, a machine tool, an OA apparatus, an AV apparatus, an optical apparatus or the like other than the scanning probe microscope.

What is claimed is:

1. A circular cylinder type piezoelectric actuator comprising:
    a circular cylinder type piezoelectric element provided with electrodes on at least an inner peripheral face and an outer peripheral face, wherein the electrode on the outer peripheral face is constituted by a single strip electrode or divided electrodes divided into a plurality of regions and electrically connected to each other, and the electrode on the outer peripheral face covers substantially a total of an outer periphery thereof and is connected to a ground potential; and
    a drive power supply for driving the circular cylinder type piezoelectric element, wherein the drive power supply is connected to the electrode provided on the inner peripheral face of the circular cylinder type piezoelectric element and applies a drive voltage to the electrode on the inner peripheral face.

2. The circular cylinder type piezoelectric actuator according to claim 1; wherein the electrode on the inner peripheral face comprises divided electrodes divided into a plurality of regions.

3. The circular cylinder type piezoelectric actuator according to claim 2; wherein the electrode on the inner peripheral face comprises a strip electrode covering a portion or a total of the inner peripheral face and is constituted by the divided electrodes divided into the plurality of regions by removing a portion of the strip electrode.

4. The circular cylinder type piezoelectric actuator according to claim 2; wherein the electrode on the inner peripheral face comprises the divided electrodes divided into the plurality of regions by masking a portion of the inner peripheral face before forming the electrode and forming the electrode at a portion other than the masked portion.

5. The circular cylinder type piezoelectric actuator according to claim 1; wherein the electrode provided on the inner peripheral face comprises a foldback portion formed by extending one end portion or both end portions thereof to fold back to a side of the outer peripheral face, and a surface area of the foldback electrode on the side of the outer peripheral face is smaller than a surface area of the electrode on the side of the outer peripheral face provided on the outer peripheral face.

6. A piezoelectric element used in the circular cylinder type piezoelectric actuator according to claim 1.

7. A scanning probe microscope integrated with the circular cylinder type piezoelectric actuator according claim 1.

8. A circular cylinder type piezoelectric actuator comprising: a compound type piezoelectric element having two or more circular cylinder type piezoelectric elements that are connected together and that are respectively provided with electrodes on at least peripheral faces and outer peripheral faces, wherein the electrode on the outer peripheral face of one circular cylinder type piezoelectric element covers substantially a total of an outer periphery thereof and is connected to a ground potential.

9. The circular cylinder type piezoelectric actuator according to claim 8; wherein the two or more circular cylinder type piezoelectric elements comprise two circular cylinder type piezoelectric elements.

10. The circular cylinder type piezoelectric actuator according to claim 9; wherein the two circular cylinder type piezoelectric elements are connected together in end-to-end relationship.

11. The circular cylinder type piezoelectric actuator according to claim 9; wherein the two circular cylinder type piezoelectric elements are nested one within the other in concentric relationship.

* * * * *